(12) United States Patent
Shin

(10) Patent No.: US 10,871,916 B2
(45) Date of Patent: Dec. 22, 2020

(54) MEMORY CONTROLLER AND METHOD OF OPERATING THE SAME

(71) Applicant: SK hynix Inc., Gyeonggi-do (KR)

(72) Inventor: Young Kyun Shin, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 51 days.

(21) Appl. No.: 16/207,375

(22) Filed: Dec. 3, 2018

(65) Prior Publication Data

US 2019/0332311 A1 Oct. 31, 2019

(30) Foreign Application Priority Data

Apr. 30, 2018 (KR) .......................... 10-2018-0050205

(51) Int. Cl.
*G06F 3/06* (2006.01)
*G11C 16/04* (2006.01)

(52) U.S. Cl.
CPC .......... *G06F 3/0655* (2013.01); *G06F 3/0604* (2013.01); *G06F 3/0616* (2013.01); *G06F 3/0679* (2013.01); *G11C 16/0483* (2013.01)

(58) Field of Classification Search
CPC .... G06F 3/0604; G06F 3/0655; G06F 3/0679; G11C 16/0483; G11C 16/10; G11C 16/32; G11C 16/349; G11C 16/3495; G11C 5/148; G11C 7/14

USPC .................................................. 711/154, 103
See application file for complete search history.

(56) References Cited

U.S. PATENT DOCUMENTS

| | | | |
|---|---|---|---|
| 10,203,912 B2* | 2/2019 | Jun ....................... | G06F 3/0688 |
| 2015/0268872 A1* | 9/2015 | Ding ..................... | G06F 3/0616 |
| | | | 711/103 |
| 2016/0034221 A1* | 2/2016 | Zettsu ................... | G06F 3/0625 |
| | | | 711/103 |
| 2017/0228159 A1 | 8/2017 | Tanaka et al. | |

FOREIGN PATENT DOCUMENTS

| KR | 101480424 | 1/2015 |
|---|---|---|
| KR | 1020150048391 | 5/2015 |

* cited by examiner

*Primary Examiner* — Hashem Farrokh
(74) *Attorney, Agent, or Firm* — IP & T Group LLP

(57) ABSTRACT

Provided herein may be a memory controller and a method of operating the same. The memory controller may control a memory device in response to a command received from a host. The memory controller may include a write amplification factor (WAF) storage and a standby state controller. The WAF storage may store a WAF of the memory device. The standby state controller may control entry of the memory controller into a standby state based on a value of the WAF stored in the WAF storage.

16 Claims, 16 Drawing Sheets

MEMORY CONTROLLER AND METHOD OF OPERATING THE SAME

CROSS-REFERENCE TO RELATED APPLICATION

The present application claims priority under 35 U.S.C. § 119(a) to Korean patent application number 10-2018-0050205, filed on Apr. 30, 2018, the entire disclosure of which is incorporated herein by reference in its entirety.

BACKGROUND

1. Field of Invention

Various embodiments of the present disclosure generally relate to a memory controller and a method of operating the memory controller. Particularly, the embodiments relate to a memory controller for controlling entry into a standby state and a method of operating the memory controller.

2. Description of Related Art

A memory device may have a two-dimensional (2D) structure in which strings are horizontally arranged on a semiconductor substrate. Alternatively, the memory device may have a three-dimensional (3D) structure in which strings are vertically stacked on a semiconductor substrate. As the 2D memory device is reaching its physical scaling limit (i.e., limit in the degree of integration), semiconductor manufacturers are producing 3D memory devices that include a plurality of memory cells vertically stacked on a semiconductor substrate. A memory controller may control the operation of the memory device.

SUMMARY

Various embodiments of the present disclosure are directed to a memory controller, which can extend the useful lifespan of a memory system.

Various embodiments of the present disclosure are directed to a method of operating a memory controller, which can extend the useful lifespan of a memory system.

An embodiment of the present disclosure may provide for a memory controller for controlling a memory device in response to a command received from a host. The memory controller may include a write amplification factor (WAF) storage and a standby state controller. The WAF storage may store a WAF of the memory device. The standby state control unit may control entry of the memory controller into a standby state based on a value of the WAF stored in the WAF storage.

In an embodiment, the standby state controller may compare the value of the WAF with a standby-prevention threshold value, and may control entry of the memory controller into the standby state, based on a result of the comparison.

In an embodiment, the standby state controller may determine an operating mode of the memory controller as any one of a normal mode and a standby-prevention mode based on the value of the WAF.

In an embodiment, the standby state controller may be configured to, when the value of the WAF is greater than the standby-prevention threshold value, control the memory controller so that the memory controller operates in the standby-prevention mode, and when the value of the WAF is less than or equal to the standby-prevention threshold value, control the memory controller so that the memory controller operates in the normal mode.

In an embodiment, the standby-prevention threshold value may include a first threshold value and a second threshold value less than the first threshold value. In this case, the standby state controller may be configured to, when the value of the WAF becomes greater than the first threshold value while the memory controller is operating in the normal mode, transition the operating mode of the memory controller to the standby-prevention mode. Further, the standby state control unit may be configured to, when the value of the WAF becomes less than the second threshold value while the memory controller is operating in the standby-prevention mode, transition the operating mode of the memory controller to the normal mode.

In an embodiment, the memory controller may enter the standby state at a lower frequency in the standby-prevention mode than that in the normal mode.

In an embodiment, the standby state controller may determine whether to enter the standby state based on a remaining power capacity of a power source for supplying power to the memory controller. In this case, in the normal mode, the standby state controller may control the memory controller so that, when the remaining power capacity of the power source is less than a first level, the memory controller enters the standby state. Further, in the standby-prevention mode, the standby state controller may control the memory controller so that, when the remaining power capacity of the power source is less than a second level, the memory controller enters the standby state. Furthermore, the second level may be less than the first level.

In an embodiment, the standby state controller may determines whether to enter the standby state, based on a waiting period measured from a time at which a command is last-received from the host. In this case, in the normal mode, the standby state controller may control the memory controller so that, when the waiting period is longer than a first period, the memory controller enters the standby state. Further, in the standby-prevention mode, the standby state controller may control the memory controller so that, when the waiting period is longer than a second period, the memory controller enters the standby state. Furthermore, the second period may be longer than the first period.

In an embodiment, the memory controller may be prevented from entering the standby state in the standby-prevention mode.

An embodiment of the present disclosure may provide for a method of operating a memory controller, the memory controller controlling an operation of a memory system including at least one memory device. The method may include determining a write amplification factor (WAF) of the memory system, comparing a value of the WAF with a standby-prevention threshold value, and controlling entry of the memory system into a standby state based on a result of the comparison.

In an embodiment, controlling entry of the memory system into the standby state based on the result of the comparison may include controlling the memory system so that the memory system operates in any one of a normal mode and a standby-prevention mode based on relative magnitudes of the value of the WAF and the standby-prevention threshold value.

In an embodiment, controlling entry of the memory system into the standby state based on the result of the comparison may include: when the value of the WAF is greater than the standby-prevention threshold value, controlling the memory system so that the memory system operates in the standby-prevention mode, and when the value of the WAF is less than or equal to the standby-prevention threshold value, controlling the memory system so that the memory system operates in the normal mode.

In an embodiment, the standby-prevention threshold value may include a first threshold value and a second threshold value less than the first threshold value. In this case, controlling entry of the memory system into the standby state based on the result of the comparison may include, when the value of the WAF becomes greater than the first threshold value while the memory system is operating in the normal mode, transitioning the operating mode of the memory system to the standby-prevention mode.

In an embodiment, the standby-prevention threshold value may include a first threshold value and a second threshold value less than the first threshold value. In this case, controlling the entry of the memory system into the standby state based on the result of the comparison may include, when the value of the WAF becomes less than the second threshold value while the memory system is operating in the standby-prevention mode, transitioning the operating mode of the memory system to the normal mode.

In an embodiment, the memory system may enter the standby state at a lower frequency in the standby-prevention mode than that in the normal mode.

In an embodiment, controlling entry of the memory system into the standby state may include: in the normal mode, when a remaining power capacity of a power source for supplying power to the memory system is less than a first level, controlling the memory system to enter the standby state, and in the standby-prevention mode, when the remaining power capacity of the power source is less than a preset second level, controlling the memory system to enter the standby state. In this case, the second level may be less than the first level.

In an embodiment, controlling entry of the memory system into the standby state may include: in the normal mode, when a waiting period measured from a time at which a command is last-received from the host is longer than a first period, controlling the memory system to enter the standby state, and in the standby-prevention mode, when the waiting period is longer than a second period, controlling the memory system to enter the standby state. In this case, the second period may be longer than the first period.

In an embodiment, in the standby-prevention mode, the memory system may be prevented from entering the standby state.

An embodiment of the present disclosure may provide for a memory system including a memory device and a memory controller. The memory controller may be configured to control the memory device. The memory controller may detect a write amplification factor of the memory device. Furthermore, the memory controller may control a frequency or number of times the memory system is permitted to transition from an operation state to a standby state based on the write amplification factor.

DETAILED DESCRIPTION

Advantages and features of the present disclosure, and methods for achieving the same are enabled in the context of embodiments described below in detail together with the accompanying drawings. The present disclosure, however, is not limited to the following embodiments. Rather, the present disclosure may be embodied in other forms, which may be modifications or variations of any of the disclosed embodiments. Accordingly, these embodiments are provided so that the present disclosure is thorough and complete and fully conveys the scope of the disclosure to those skilled in the art. It is further noted that, throughout the specification, reference to "an embodiment" or the like is not necessarily to only one embodiment, and different references to any such phrase are not necessarily to the same embodiment(s).

It is also noted that in this specification, "connected/coupled" refers to one component not only directly coupling another component but also indirectly coupling another component through one or more intermediate components. In the specification, when an element is referred to as "comprising" or "including" a component, such open ended term does not preclude another component but may further include one or more other components, unless the context clearly indicates otherwise.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Figure 1:
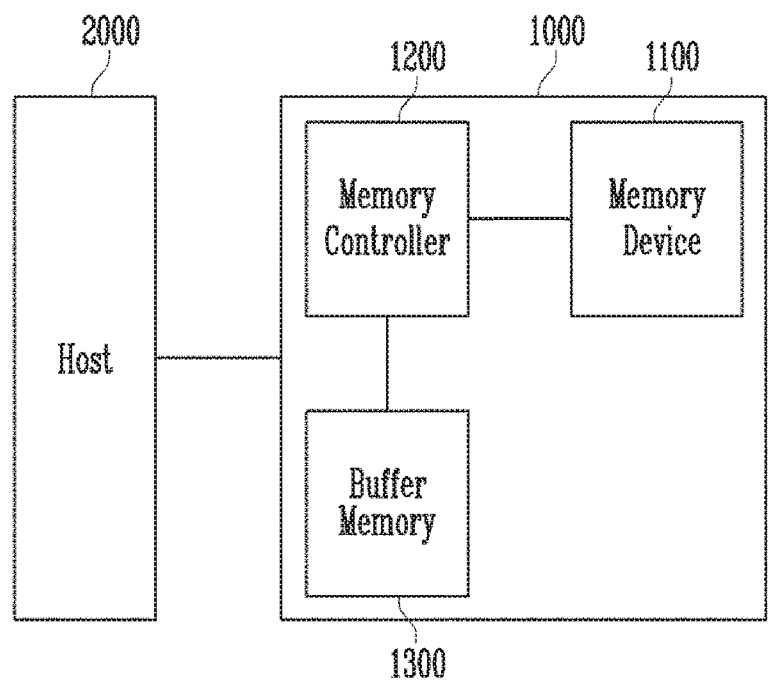
FIG. 1 is a diagram illustrating a memory system.

FIG. 1 is a diagram illustrating a memory system 1000.

Referring to FIG. 1, the memory system 1000 may include a memory device 1100 which stores data, a memory controller 1200 and a buffer memory 1300. The buffer memory 1300 temporarily stores data required for the operation of the memory system 1000. The memory controller 1200 controls the memory device 1100 and the buffer memory 1300 under the control of a host 2000.

The host 2000 may communicate with the memory system 1000 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

The memory device 1100 may be implemented as a volatile memory device in which stored data is lost when the supply of power is interrupted or as a nonvolatile memory device in which stored data is retained even when the supply of power is interrupted. The memory device 1100 may perform a program operation, a read operation, or an erase operation under the control of the memory controller 1200. For example, during a program operation, the memory device 1100 may receive a command, an address, and data from the memory controller 1200, and may perform the program operation. During a read operation, the memory device 1100 may receive a command and an address from the memory controller 1200, and may output read data to the memory controller 1200. For this operation, the memory device 1100 may include an input/output circuit for inputting and outputting data.

The memory controller 1200 may control the overall operation of the memory system 1000, and may control data exchange between the host 2000 and the memory device 1100. For example, the memory controller 1200 may program, read or erase data by controlling the memory device 1100 in response to a request received from the host 2000. Also, the memory controller 1200 may receive data and a logical address from the host 2000, and may translate the logical address into a physical address indicating the area of the memory device 1100 in which the data is to be stored. Further, the memory controller 1200 may store a logical-to-physical address mapping table, which sets forth mapping relationships between logical addresses and physical addresses, in the buffer memory 1300.

The buffer memory 1300 may be used as a working memory or a cache memory of the memory controller 1200, and may store system data that is used in the memory system 1000 in addition to the above-described information. In an embodiment, the buffer memory 1300 may include a double data rate synchronous dynamic random access memory (DDR SDRAM), DDR SDRAM fourth generation (DDR4 SDRAM), a low power DDR SDRAM fourth generation (LPDDR4 SDRAM), a graphics double data rate (GDDR) SDRAM, a low power DDR (LPDDR) SDRAM, or a Rambus DRAM (RDRAM).

The memory controller 1200 may control whether the memory system 1000 enters a standby state. For example, when there is a need to reduce power consumption of the memory system 1000 due to low or insufficient battery power, the memory system 1000 may enter the standby state from an operation state. In an embodiment, when the memory system 1000 does not receive a subsequent request or command for a set period of time after receiving a request or a command from the host 2000, the memory system 1000 may enter the standby state from the operation state. When a request or a command is received from the host 2000 while the memory system 1000 is in a standby state, the memory system 1000 may terminate the standby state and enter the operation state, and may then process the request or command received from the host 2000.

When the memory system 1000 should enter the standby state from the operation state, the memory system 1000 may flush write data stored in the buffer memory 1300 before entering the standby state. The term "flush" may mean an operation of transferring the write data stored in the buffer memory 1300 to the memory device 1100, and then controlling the memory device 1100 so that the received write data is programmed to the memory device 1100. After the flush operation has been completed, the memory system 1000 may enter the standby state.

When the memory system 1000 frequently enters the standby state, a write amplification factor (WAF) for the memory device 1100 or the memory system 1000 may increase. The write amplification factor (WAF) may indicate the ratio of the size of data programmed to the memory device 1100 to the size of write data received from the host 2000. The write amplification factor, that is, a relationship between the size of the data programmed to the memory device 1000 to the size of the write data received from the host 2000, may be represented by the following Equation (1):

$$WAF = \frac{\text{Total amount of Physical Write}}{\text{Total amount of Host Write}} \qquad (1)$$

In the above Equation (1), "Total amount of Physical Write" means the amount of data programmed to the memory device 1100. The term "Total amount of Host Write" means the total amount of write data received by the memory system 1000 from the host 2000.

Generally, the amount of data programmed to the memory device 1100 is greater than the amount of write data received from the host 2000. Accordingly, in most cases, WAF has a value greater than 1. In an example, parity bits required to perform error correction in the memory controller 1200 may be added to the data received from the host 2000, and the resulting data may then be programmed to the memory device 1100. During this procedure, the amount of data to be programmed to the memory device 1100 may increase. Also, dummy data for improving the threshold value voltage characteristics of memory cells in the memory device 1100 may be added to the received data from the host 2000.

When the memory system 1000 more frequently enters a standby state, the above-described flush operation may also be frequently performed. When the flush operation is performed, the dummy data may be added to write data stored in the buffer memory 1300, and the resulting write data may be transferred to the memory device 1100. Thus, as the flush operation is more frequently performed, the ratio of the dummy data to the write data received from the host 2000 may be relatively increased.

As described above, when the memory system 1000 frequently enters the standby state, the write amplification factor (WAF) increases. When the WAF increases, the lifespan of the memory device 1100 may be relatively shortened. The reason for this is that the size of the data programmed to the memory device 1100 increases compared to the write data received from the host 2000, and thus the number of program/erase cycles rapidly increases.

In various embodiments, when the WAF exceeds a specific threshold value, the memory system 1000 may be prevented from entering the standby state. The WAF of the memory device 1100 may be monitored either in real time or periodically. Accordingly, the WAF of the memory device 1100 may be maintained at a low level, thus extending the useful lifespan of the memory device 1100.

Figure 2:
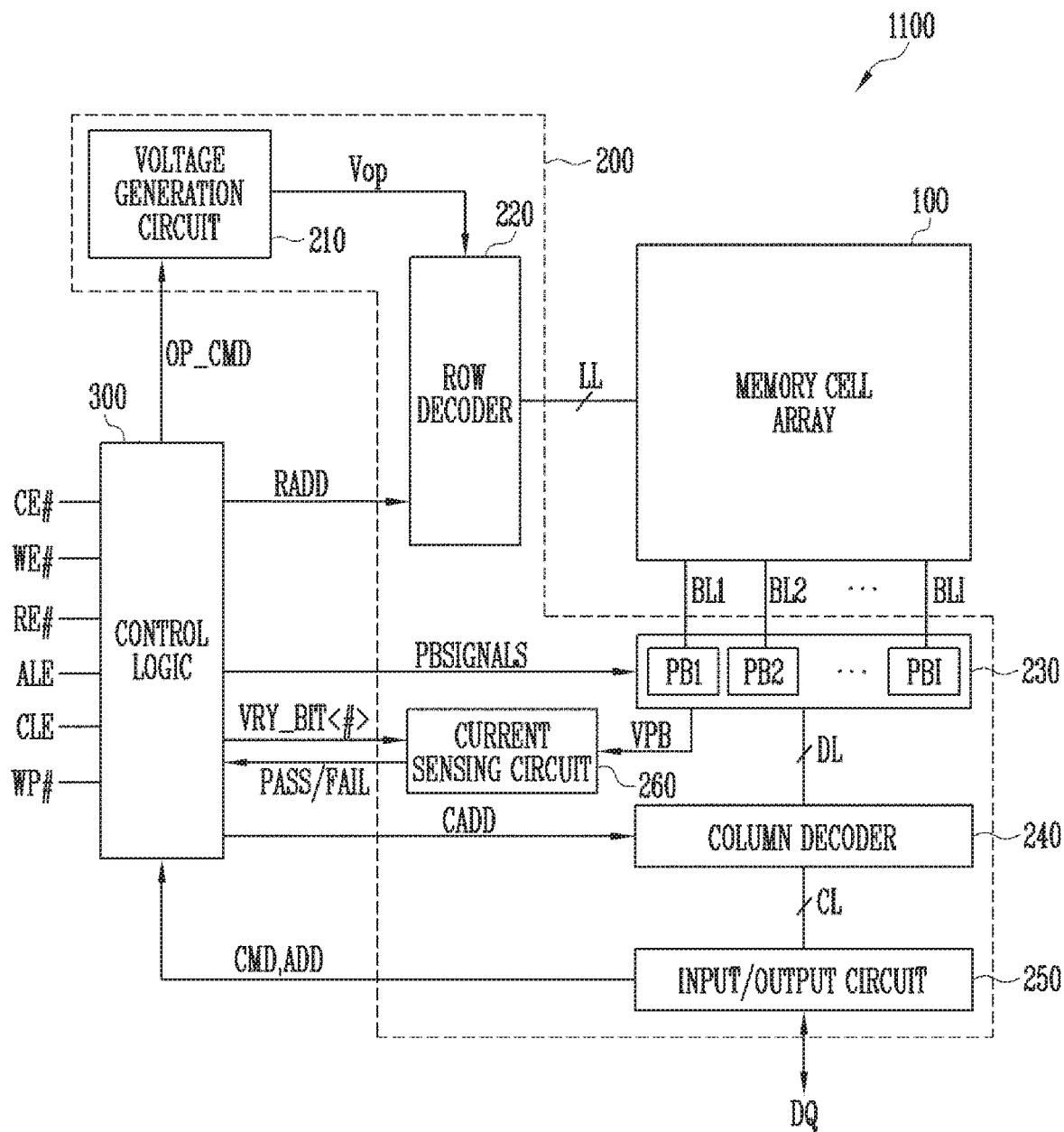
FIG. 2 is a diagram illustrating a memory device shown in FIG. 1.

FIG. 2 is a diagram illustrating the memory device 1100 shown in FIG. 1.

Referring to FIG. 2, the memory device 1100 may be implemented as a volatile memory device or a nonvolatile memory device. Although a nonvolatile memory device is illustrated as an example in FIG. 2, the present invention is not limited to the nonvolatile memory device.

The memory device 1100 may include a memory cell array 100 in which data is stored. The memory device 1100 may include a peripheral circuit 200 configured to perform a program operation for storing data in the memory cell array 100, a read operation for outputting the stored data, and an erase operation for erasing the stored data. The memory device 1100 may include control logic 300 which controls the peripheral circuit 200 under the control of a memory controller (e.g., memory controller 1200 of FIG. 1).

The memory cell array 100 includes a plurality of memory cells in which data is stored. For example, the memory cell array 100 may include a plurality of memory blocks. Each of the memory blocks may include a plurality of memory cells. In the memory blocks, user data and various types of information required for the operation of the memory device 1100 may be stored. Each of memory blocks may be implemented in a two-dimensional (2D) structure or a three-dimensional (3D) structure, the latter of which enables a higher degree of integration. Each memory block having a 2D structure may include memory cells which are arranged in parallel on a substrate. Each memory block having a 3D structure may include memory cells which are vertically stacked on a substrate.

The peripheral circuit 200 may perform program, read, and erase operations under the control of the control logic 300. For example, the peripheral circuit 200 may include a voltage generation circuit 210, a row decoder 220, a page buffer group 230, a column decoder 240, an input/output circuit 250, and a current sensing circuit 260.

The voltage generation circuit 210 may generate various operating voltages Vop that are used for program, read, and erase operations in response to an operation signal OP_CMD received from the control logic 300. For example, the voltage generation circuit 210 may generate various voltages, such as a program voltage, a verify voltage, a pass voltage, a read voltage, and an erase voltage, under the control of the control logic 300.

The row decoder 220 may transfer the operating voltages Vop to local lines LL coupled to a memory block selected from among the memory blocks of the memory cell array 100 in response to a row address RADD. The local lines LL may include local word lines, local drain select lines, and local source select lines. In addition, the local lines LL may include various lines, such as source lines, coupled to the memory blocks.

The page buffer group 230 may be coupled to bit lines BL1 to BLI coupled to the memory blocks of the memory cell array 100. The page buffer group 230 may include a plurality of page buffers PB1 to PBI coupled to the bit lines BL1 to BLI. The page buffers PB1 to PBI may be operated in response to page buffer control signals PBSIGNALS. For example, the page buffers PB1 to PBI may temporarily store data received through the bit lines BL1 to BLI or may sense voltages or currents of the bit lines BL1 to BLI during a read or verify operation.

The column decoder 240 may transfer data between the input/output circuit 250 and the page buffer group 230 in response to a column address CADD. For example, the column decoder 240 may exchange data with the page buffers PB1 to PBI through data lines DL or may exchange data with the input/output circuit 250 through column lines CL.

The input/output circuit 250 may receive a command CMD, an address ADD, and data from the memory controller (e.g., memory controller 1200 of FIG. 1) through an input/output pad DQ, and may output read data to the memory controller 1200 through the input/output pad DQ. For example, the input/output circuit 250 may transmit the command CMD and the address ADD, received from the memory controller 1200, to the control logic 300, or may exchange the data with the column decoder 240.

During a read or verify operation, the current sensing circuit 260 may generate a reference current in response to an enable bit VRY_BIT<#>. The current sensing circuit 260 may compare a sensing voltage VPB received from the page buffer group 230 with a reference voltage generated by the reference current, and then output a pass signal PASS or a fail signal FAIL.

The control logic 300 may receive the command CMD and the address ADD in response to signals received through pads, such as CE #, WE #, RE #, ALE, CLE, and WP #. The control logic 300 may output the operation signal OP_CMD, the row address RADD, the page buffer control signals PBSIGNALS, and the enable bit VRY_BIT<#> in response to the command CMD and the address ADD, and may then control the peripheral circuit 200. The control logic 300 may determine whether a verify operation has passed or failed in response to the pass or fail signal PASS or FAIL.

Figure 3:
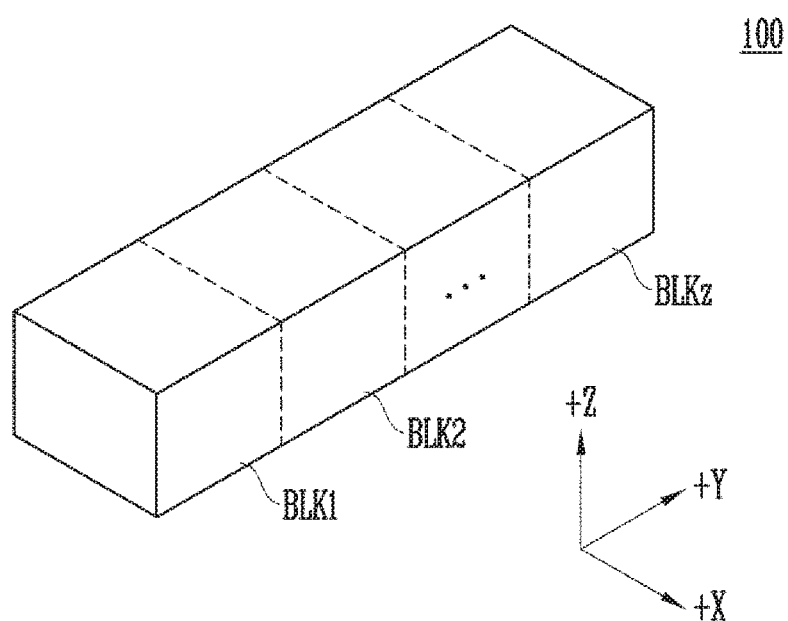
FIG. 3 is a diagram illustrating an example of a memory cell array shown in FIG. 2.

FIG. 3 is a diagram illustrating an example of the memory cell array 100 shown in FIG. 2.

Referring to FIG. 3, the memory cell array 100 includes a plurality of memory blocks BLK1 to BLKz. Each memory block may have a three-dimensional (3D) structure. Each memory block includes a plurality of memory cells stacked on a substrate. Such memory cells are arranged along a positive X (+X) direction, a positive Y (+Y) direction, and a positive Z (+Z) direction. The structure of each memory block will be described in detail below with reference to FIGS. 4 and 5.

Figure 4:
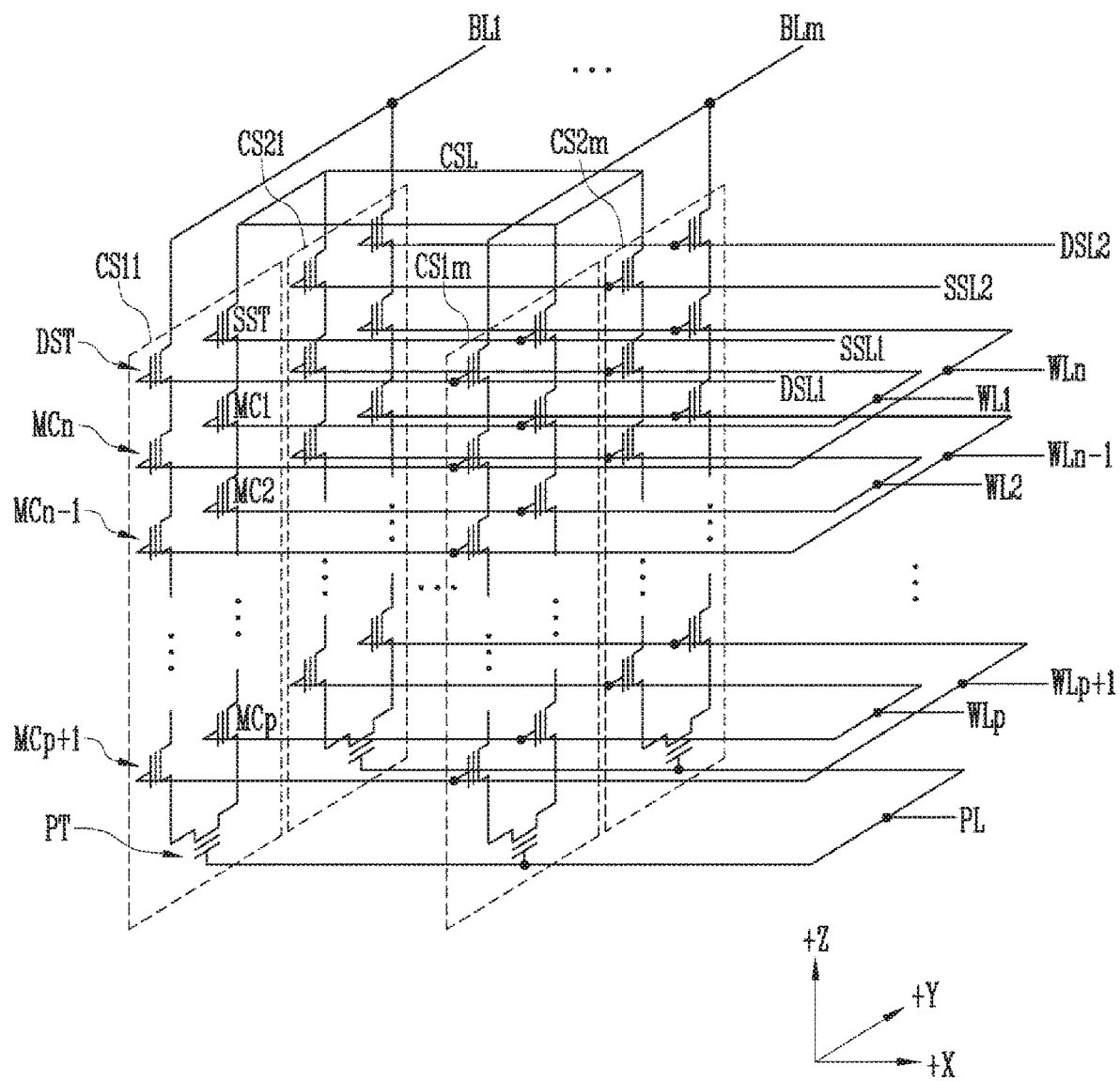
FIG. 4 is a circuit diagram illustrating any one memory block among plurality of memory blocks shown in FIG. 3.

FIG. 4 is a circuit diagram illustrating any one memory block BLKa among the plurality of memory blocks BLK1 to BLKz shown in FIG. 3.

Referring to FIG. 4, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e., positive (+) X direction). In FIG. 4, two cell strings are illustrated as being arranged in a column direction (i.e., positive (+) Y direction). However, this illustration is for clarity; three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 4, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1$m$ in the first row are coupled to a first drain select line DSL1. Drain select transistors of cell strings CS21 to CS2$m$ in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1$m$ and CS2$m$ in an m-th column are coupled to an m-th bit line BLm.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1, among the cell strings CS21 to CS2$m$ in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1$m$ or CS21 to CS2$m$ arranged in a row direction, may be coupled to the even bit lines, respectively, and odd-numbered cell strings, among the cell strings CS11 to CS1$m$ or CS21 to CS2$m$ arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the dummy memory cell(s), each may have a required threshold value voltage. Before or after the erase operation of the memory block BLKa is performed, a program operation may be performed on all or some of the dummy memory cells. When an erase operation is performed after the program operation has been performed, the threshold value voltages of the dummy memory cells control the voltages that are applied to the dummy word lines coupled to respective dummy memory cells, and thus the dummy memory cells may have required threshold value voltages.

Figure 5:
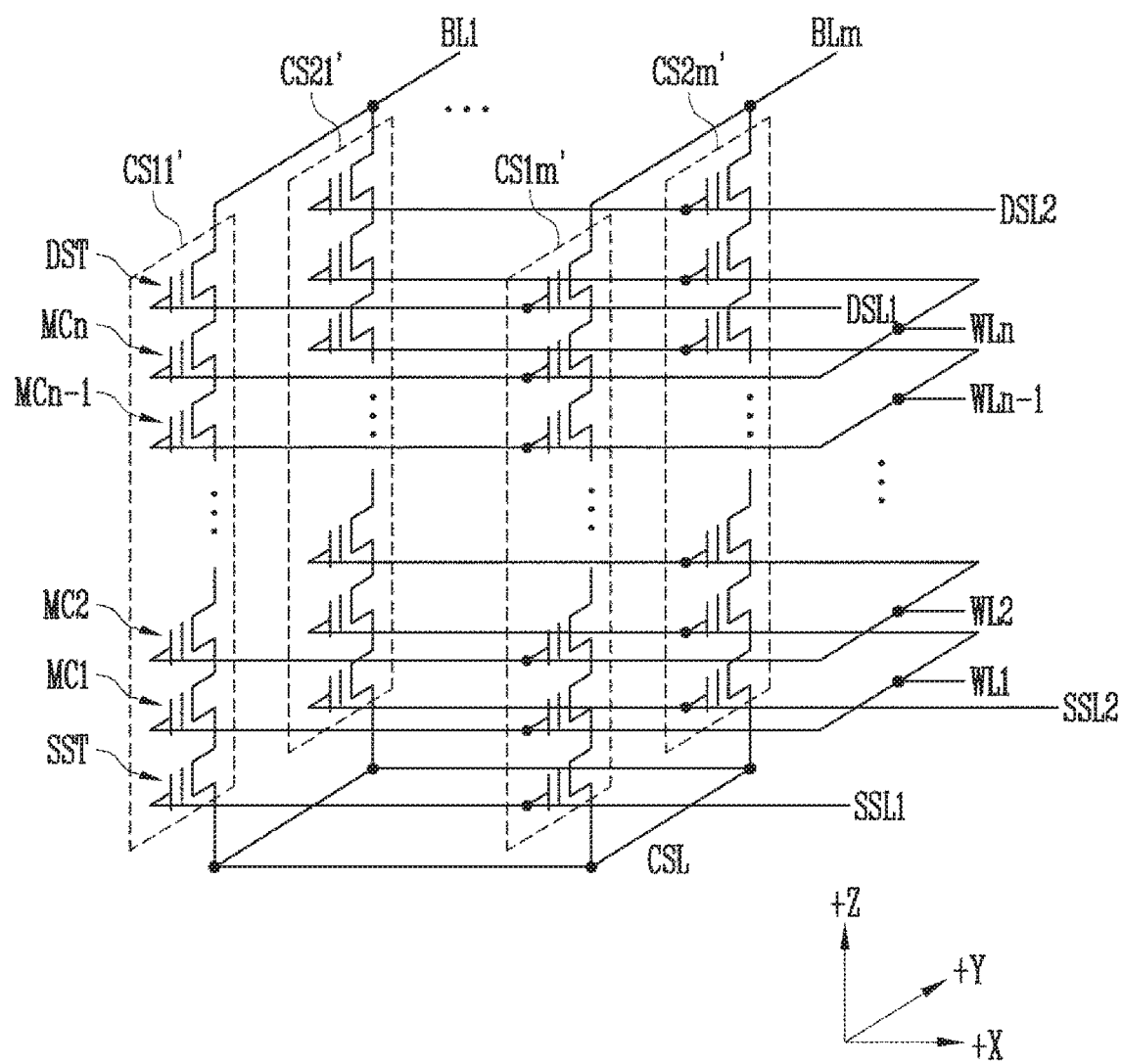
FIG. 5 is a circuit diagram illustrating any one memory block among plurality of memory blocks shown in FIG. 3.

FIG. 5 is a circuit diagram illustrating any one memory block BLKb among the plurality of memory blocks BLK1 to BLKz shown in FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' is extended along a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has a circuit similar to that of the memory block BLKa of FIG. 4. For example, the pipe transistor PT included in each cell string in the memory block BLKa of FIG. 4 is excluded in each cell string in the memory block BLKb of FIG. 5.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the dummy memory cell(s), each may have a required threshold value voltage. Before or after the erase operation of the memory block BLKb is performed, a program operation may be performed on all or some of the dummy memory cells. When an erase operation is performed after the program operation has been performed, the threshold value voltages of the dummy memory cells control the voltages that are applied to the dummy word lines coupled to respective dummy memory cells, and thus the dummy memory cells may have required threshold value voltages.

Figure 6:
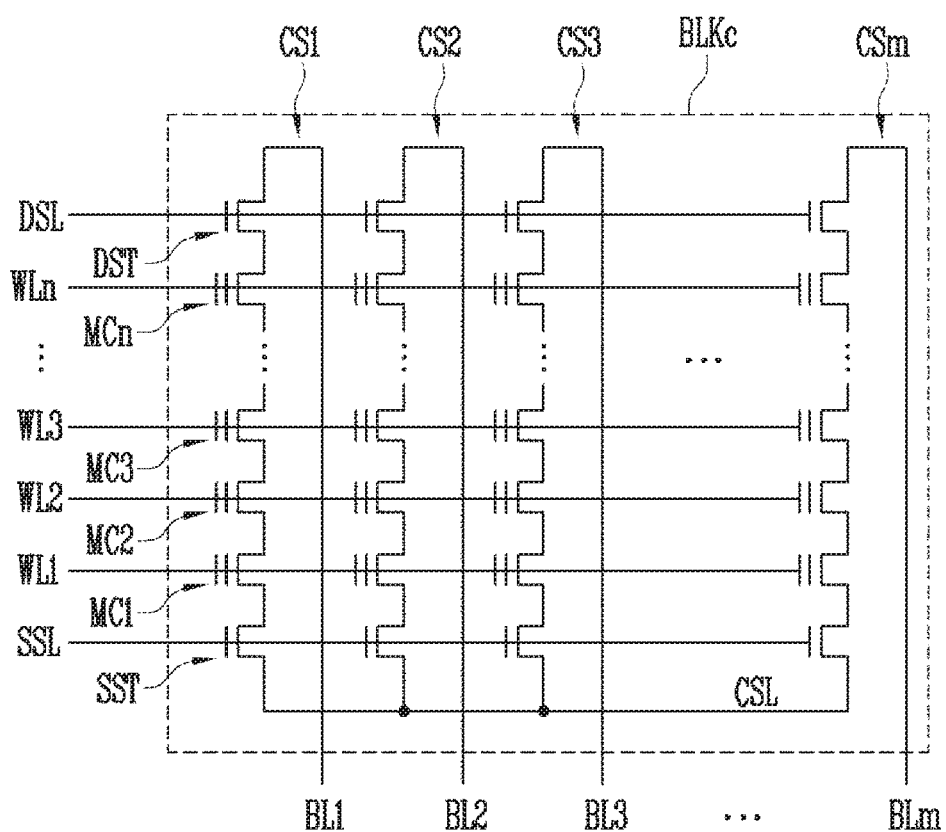
FIG. 6 is a circuit diagram illustrating any one memory block among plurality of memory blocks in the memory cell array shown in FIG. 2.

FIG. 6 is a circuit diagram illustrating any one memory block BLKc among the plurality of memory blocks included in the memory cell array 100 shown in FIG. 2.

Referring to FIG. 6, the memory block BLKc includes a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

As illustrated in FIGS. 3 to 5, the memory cell array 100 of the memory device 1100 may be implemented as a memory cell array having a 3D structure. Further, as illustrated in FIG. 6, the memory cell array 100 of the memory device 1100 may be implemented as a memory cell array having a 2D structure.

Figure 7:
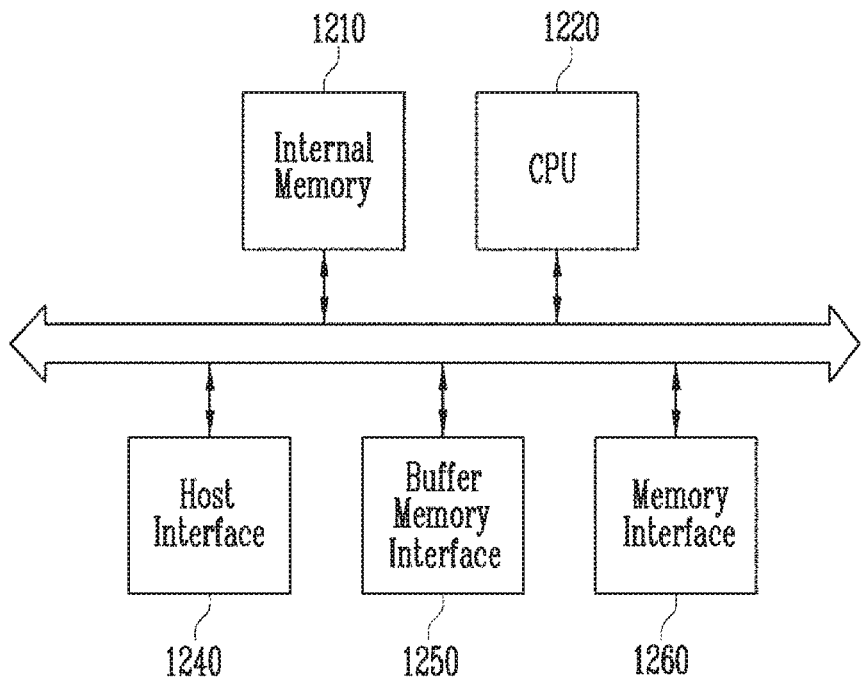
FIG. 7 is a diagram illustrating the memory controller shown in FIG. 1.

FIG. 7 is a diagram illustrating the memory controller 1200 shown in FIG. 1.

Referring to FIG. 7, the memory controller 1200 may include an internal memory 1210, a processor such as central processing unit (CPU) 1220, a host interface 1240, a buffer memory interface 1250, and a memory interface 1260.

The internal memory 1210 may store various types of information required for the operation of the memory controller 1200. For example, the internal memory 1210 may include logical-to-physical address mapping tables. The internal memory 1210 may be configured using one or more of a random access memory (RAM), a dynamic RAM (DRAM), a static RAM (SRAM), a cache, and a tightly coupled memory (TCM).

The CPU 1220 may perform various types of operations for controlling the memory device 1100 or may generate various commands. When a request is received from the host 2000, the CPU 1220 may generate a command in response to the received request, and may transfer the command to the memory device 1100 through the memory interface 1260.

The host interface 1240 may exchange commands, addresses, and data between the memory controller 1200 and the host 2000. For example, the host interface 1240 may receive requests, addresses, and data from the host 2000, and may output data read from the memory device 1100 to the host 2000. The host interface 1240 may communicate with the host 2000 using an interface protocol, such as a peripheral component interconnect express (PCI-e or PCIe), advanced technology attachment (ATA), serial ATA (SATA), parallel ATA (PATA), serial attached SCSI (SAS) or non-volatile memory express (NVMe) interface protocol. The host interface 1240 is not limited to the above-described examples; any of various other interfaces may be used, such as universal serial bus (USB), multi-media card (MMC), enhanced small disk interface (ESDI), or integrated drive electronics (IDE) interfaces.

The buffer memory interface 1250 may transfer data between the CPU 1220 and the buffer memory 1300 of FIG. 1. In accordance with an embodiment, when the buffer memory 1300 is included in the memory controller 1200, the buffer memory interface 1250 may be omitted.

The memory interface 1260 may exchange commands, addresses, and data between the memory controller 1200 and the memory device 1100. For example, the memory interface 1260 may transmit commands, addresses, and data to the memory device 1100 through a channel, and may receive data or the like from the memory device 1100.

Figure 8:
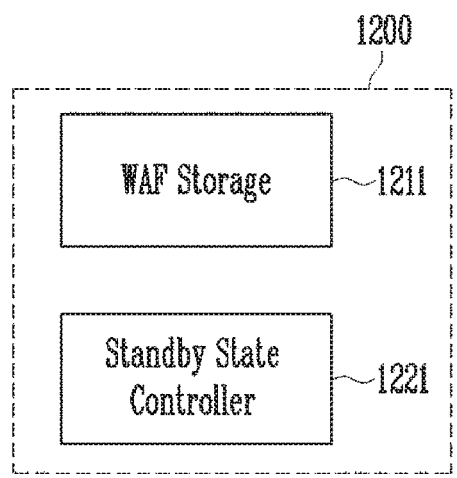
FIG. 8 is a block diagram illustrating a memory controller according to an embodiment of the present disclosure.

FIG. 8 is a block diagram illustrating a memory controller according to an embodiment of the present disclosure, for example, the memory controller 1200 of FIG. 7.

Referring to FIG. 8, the memory controller 1200 may include a write amplification factor (WAF) storage 1211 and a standby state controller 1221. The WAF storage 1211 may store a WAF of the memory device 1100. In detail, the memory controller 1200 may receive write data from the host 2000, and may transfer a program command and program data to the memory device 1100. In this procedure, the memory controller 1200 may update the WAF in real time by accumulatively calculating the amount of received write data and by accumulatively calculating the amount of program data transferred to the memory device 1100. The updated WAF may be stored in the WAF storage 1211. The WAF storage 1211 may be implemented as the internal memory 1210 of FIG. 7. In other embodiments, the WAF storage 1211 may be implemented as a part of the buffer memory 1300 of FIG. 1.

The standby state controller 1221 may determine the operating mode of the memory controller 1200 or the entire memory system based on the WAF stored in the WAF storage 1211. In an embodiment, the standby state controller 1221 may determine the operating mode by comparing the current value of the WAF stored in the WAF storage 1211 with a standby-prevention threshold value, which may be preset. The standby state controller 1221 may be implemented by the CPU 1220 of FIG. 7. For example, the operation of the standby state controller 1221 may be performed as a part of firmware functions executed by the CPU 1220 of FIG. 7.

In an embodiment, when the value of the current WAF stored in the WAF storage 1211 is greater than the standby-prevention threshold value, the standby state controller 1221 controls the memory controller 1200 and/or the memory system 1000 to operate in a standby-prevention mode. In the standby-prevention mode, the memory controller 1200 and/or the memory system 1000 are prevented or inhibited from entering the standby state. Accordingly, while the memory controller 1200 and/or the memory system 1000 are operating in the standby-prevention mode, the frequency at which, or the number of times, the memory controller 1200 and/or the memory system 100 enter the standby state may be reduced or may be 0. Accordingly, the value of the WAF may gradually decrease.

In an embodiment, when the value of the current WAF stored in the WAF storage 1211 is less than or equal to the standby-prevention threshold value, the standby state controller 1221 allows the memory controller 1200 and/or the memory system 1000 to operate in a normal mode. In the normal mode, the memory controller 1200 and/or the memory system 1000 are not prevented from entering the standby state. Accordingly, the frequency at which, or the number of times, the memory controller 1200 and/or the memory system 1000 enter the standby state in the normal mode is greater than that in the standby-prevention mode. Accordingly, the value of the WAF may increase.

A detailed method of operating the memory controller 1200 according to an embodiment of the present disclosure will be described in detail below with reference to FIGS. 9 to 15B.

Figure 9:
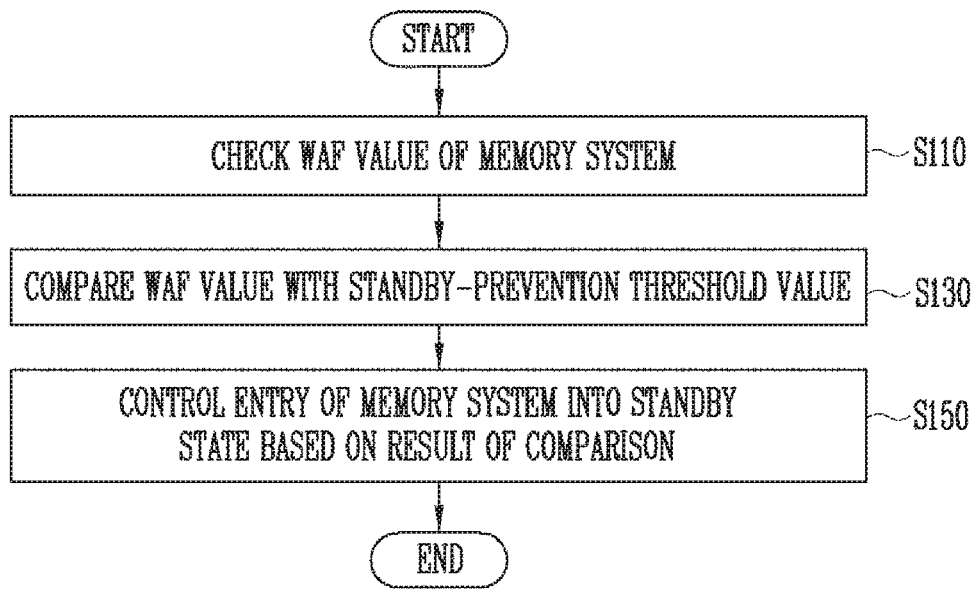
FIG. 9 is a flowchart describing a method of operating a memory controller according to an embodiment of the present disclosure.

FIG. 9 is a flowchart describing a method of operating a memory controller according to an embodiment of the present disclosure, for example, the memory controller 1200.

Referring to FIG. 9, the method of operating the memory controller 1200 may include the step S110 of checking or determining the value of a write amplification factor (WAF) of a memory system 1000, the step S130 of comparing the value of the WAF obtained in step S110 with a standby-prevention threshold value, and the step S150 of controlling, based on the result of the comparison, entry of the memory system 1000 into a standby state, that is, whether the memory system 1000 is permitted to enter the standby state.

At step S110, the standby state controller 1221 illustrated in FIG. 8 may check the value of a current WAF stored in the WAF storage 1211. At step S130, the standby state controller 1221 may compare the value of the WAF checked at step S110 with the standby-prevention threshold value. The standby-prevention threshold value may be a reference value for deciding a standby-prevention mode or a normal mode, and may be suitably set in advance depending on a design requirement.

Thereafter, at step S150, based on the result of the comparison at step S130, the entry of the memory system 1000 into a standby state is controlled. In detail, at step S150, the operating mode of the memory system 1000 may be determined. As described above, the operating mode may be determined to be the standby-prevention mode or the normal mode. In the standby-prevention mode, the transition frequency of the memory system 1000 and/or the memory controller 1200 from the operation state to the standby state may be lowered. Alternatively, transition from the operation state to the standby state may be prevented. Accordingly, in the standby-prevention mode, the value of the WAF may be reduced. Therefore, the useful lifespan of the memory device 1100 and the entire memory system 1000 including the memory device 1100 may be extended.

In FIG. 9, each of steps S110, S130, and S150 may be periodically and repetitively performed during the operation of the memory system 1000. An example of step S150 will be described in detail below with reference to FIGS. 10 to 13.

Figure 10:
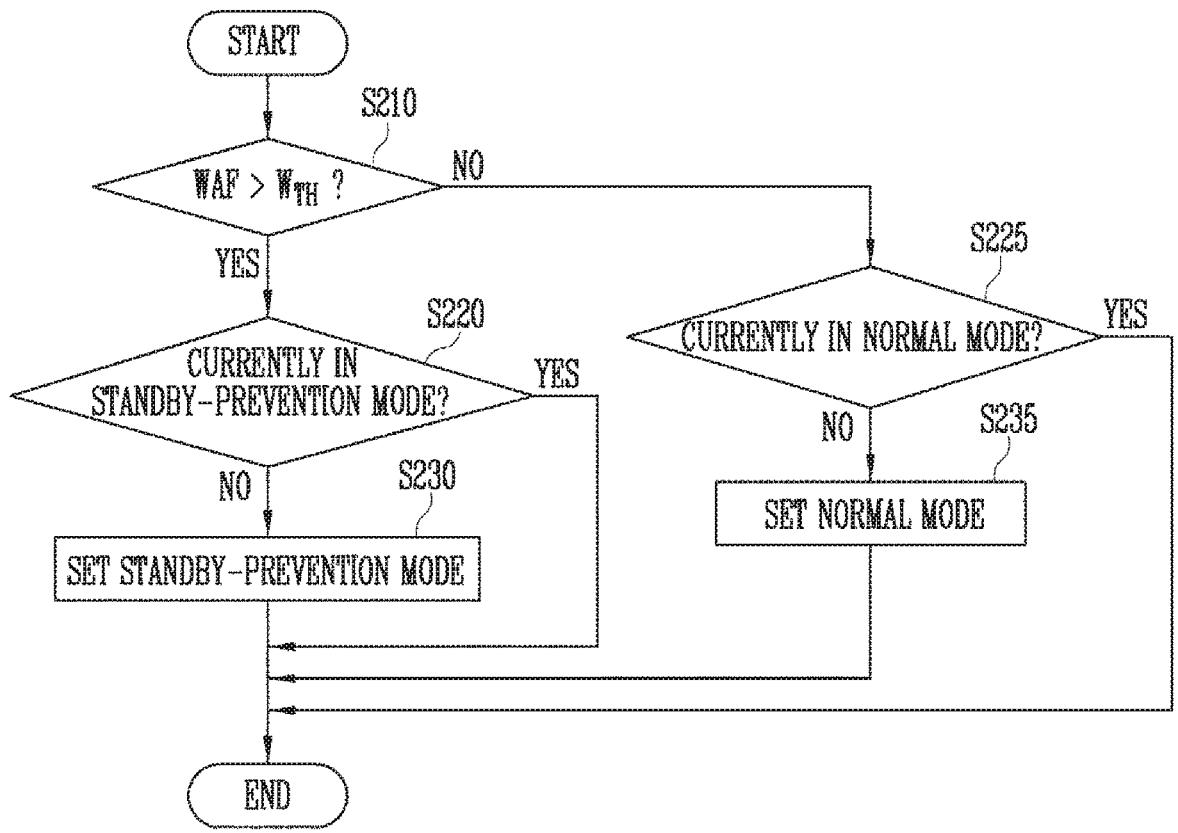
FIG. 10 is a flowchart describing a method of controlling entry of a memory system into a standby state according to an embodiment of the present disclosure.

FIG. 10 is a flowchart describing a method of controlling entry of a memory system into a standby state according to an embodiment of the present disclosure, for example, the step S150 illustrated in FIG. 9.

Referring to FIG. 10, at step S210, whether the value of a WAF (e.g., the current WAF) is greater than a standby-prevention threshold value (e.g., a reference value) $W_{TH}$ is determined. When it is determined that the value of the WAF is greater than the standby-prevention threshold value $W_{TH}$ (that is, "YES" at step S210), the memory system 1000 and/or the memory controller 1200 should operate in a standby-prevention mode. Accordingly, at step S220, whether the memory system 1000 and/or the memory controller 1200 are currently operating in the standby-prevention mode is determined. When it is determined that the memory system 1000 and/or the memory controller 1200 are currently operating in the standby-prevention mode (that is, "YES" at step S220), there is no need to change the operating mode.

When it is determined that the memory system 1000 and/or the memory controller 1200 are not currently operating in the standby-prevention mode (that is, "NO" at step S220), it may be determined that they are operating in a normal mode. Therefore, the process proceeds to step S230 where the operating mode of the memory system 1000 and/or the memory controller 1200 is set to the standby-prevention mode.

Returning to step S210, when it is determined that the value of the WAF is less than or equal to the standby-prevention threshold value $W_{TH}$ (that is, "NO" at step S210), the memory system 1000 and/or the memory controller 1200 should operate in the normal mode. Accordingly, whether the memory system 1000 and/or the memory controller 1200 are currently operating in the normal mode is determined at step S225. When it is determined that the memory system 1000 and/or the memory controller 1200 are currently operating in the normal mode (that is, "YES" at step S225), there is no need to change the operating mode.

When it is determined that the memory system 1000 and/or the memory controller 1200 are not currently operating in the normal mode (that is, "NO" at step S225), it may be determined that they are operating in the standby-prevention mode. Therefore, the process proceeds to step S235 where the operating mode of the memory system 1000 and/or the memory controller 1200 is set to the normal mode.

Figure 11:
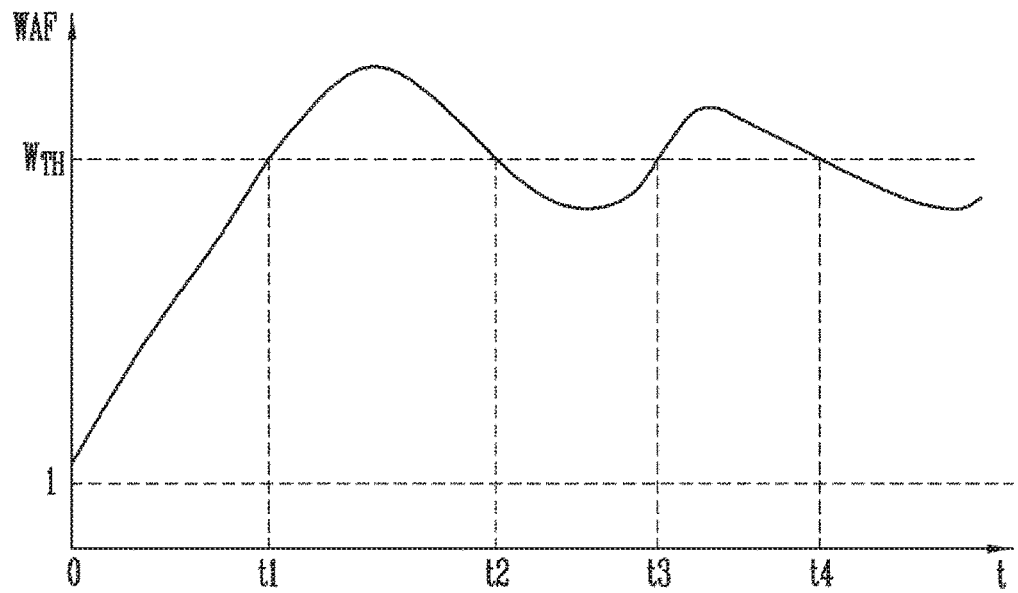
FIG. 11 is a graph illustrating changes of a write amplification factor (WAF) over time and application of individual steps of FIG. 10 in this context, in accordance with an embodiment of the present disclosure.

FIG. 11 is a graph illustrating WAF changes over time. The individual steps of FIG. 10 are described in the context of this WAF fluctuation.

Referring to the graph illustrated in FIG. 11, a horizontal axis denotes a time (t) axis, and a vertical axis denotes the WAF values of the memory system 1000 and/or the memory device 1100.

During an interval from time 0 to time t1, the WAF of the memory system 1000 and/or the memory device 1100 has a value less than a standby-prevention threshold value $W_{TH}$. Accordingly, at steps S210, S225, and S235 of FIG. 10, the memory system 100 and/or the memory controller 1200 may operate in a normal mode. Accordingly, during the interval from time 0 to time t1, the memory system 1000 and/or the memory controller 1200 may transition from an operation state to a standby state or from the standby state to the operation state. During the interval from time 0 to time t1, the memory system 1000 and/or the memory controller 1200 operate in the normal mode, and thus the value of the WAF may increase.

After time t1, the value of the WAF of the memory system 1000 and/or the memory device 1100 becomes greater than the standby-prevention threshold value $W_{TH}$. Accordingly, at steps S210, S220, and S230 of FIG. 10, the memory system 100 and/or the memory controller 1200 may operate in the standby-prevention mode. As a result, during an interval from time t1 to time t2, the memory system 1000 and/or the memory controller 1200 may be prevented from transitioning to the standby state or may not entirely transition to the standby state. Accordingly, during the interval from time t1 to time t2, the value of the WAF of the memory system 1000 and/or the memory device 1100 may be gradually reduced.

During an interval from the time t2 to time t3, the memory system 1000 and/or the memory controller 1200 may operate in the normal mode, and thus the value of the WAF may also gradually increase. The same is true in an interval after time t4.

During an interval from time t3 to time t4, the memory system 1000 and/or the memory controller 1200 may operate in the standby-prevention mode, and thus the value of the WAF may also gradually decrease.

As illustrated in FIG. 11, in accordance with an embodiment of the present disclosure, the value of the WAF of the memory system 1000 and/or the memory device 1100 may change within a range above and below the standby-prevention threshold value $W_{TH}$. Therefore, a situation in which the value of the WAF greatly increases may be prevented, and thus the useful lifespan of the memory device 1100 and the memory system 1000 including the memory device 1100 may be extended.

However, in accordance with the embodiments of FIGS. 10 and 11, the operating mode of the memory system 1000 and/or the memory controller 1200 may change too frequently with respect to the standby-prevention threshold value $W_{TH}$. The frequent change of the operating mode may exert a burden on the operation of the memory controller 1200. Accordingly, an embodiment in which a change in the operating mode of the memory system 1000 and/or the memory controller 1200 is reduced will be described below.

Figure 12:
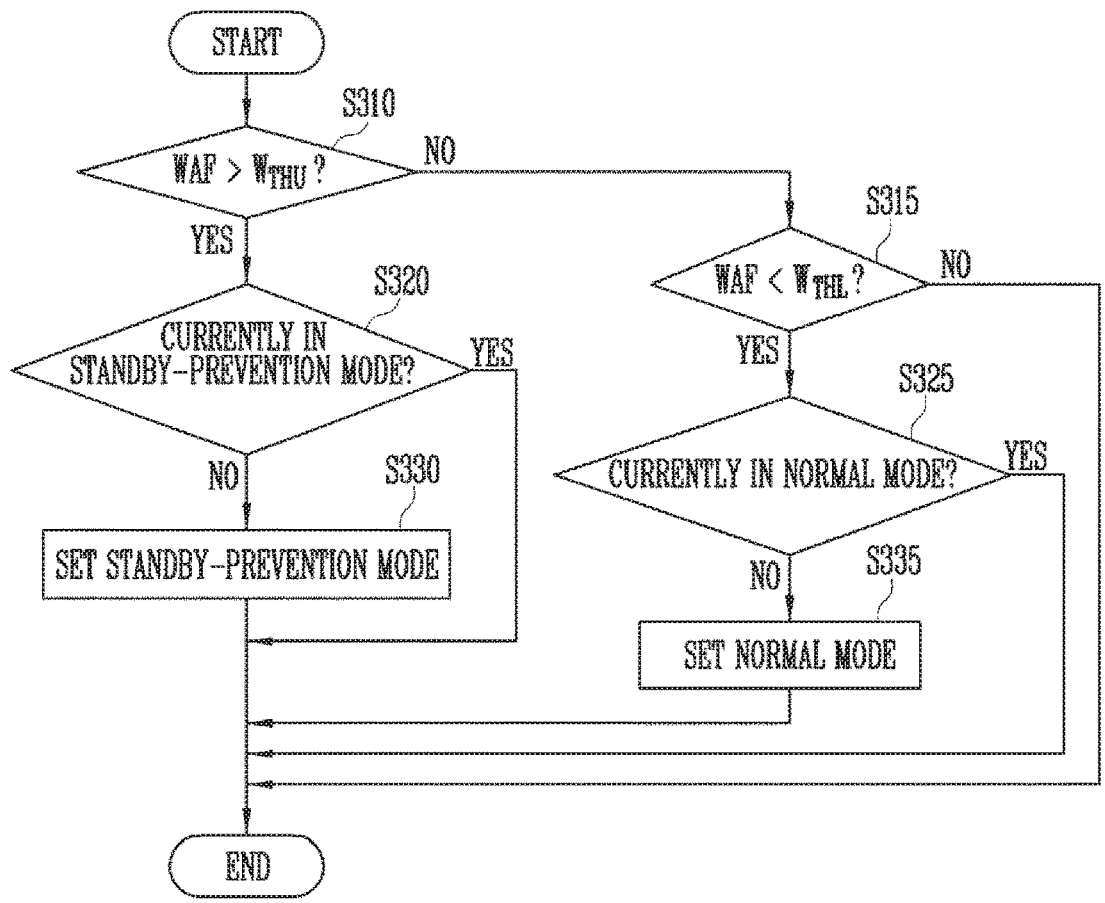
FIG. 12 is a flowchart describing a method of controlling entry of a memory system into a standby state according to an embodiment of the present disclosure.

FIG. 12 is a flowchart describing a method of controlling entry of a memory system into a standby state according to an embodiment of the present disclosure, for example, the step S150 illustrated in FIG. 9. There is a difference between the examples of FIGS. 10 and 12 in that, in the example of FIG. 10, the value of a WAF is compared with a single reference value (that is, a standby-prevention threshold value $W_{TH}$), whereas, in the example of FIG. 12, the value of a WAF is compared with an upper standby-prevention threshold value ($W_{THU}$) and a lower standby-prevention threshold value ($W_{THL}$). Below, individual steps are described in detail.

Referring to FIG. 12, at step S310, whether the value of a WAF is greater than an upper standby-prevention threshold value $W_{THU}$ is determined. When it is determined that the value of the WAF is greater than the upper standby-prevention threshold value $W_{THU}$ (that is, "YES" at step S310), the memory system 1000 and/or the memory controller 1200 should operate in a standby-prevention mode. Accordingly, whether the memory system 1000 and/or the memory controller 1200 are currently operating in the standby-prevention mode is determined at step S320. When it is determined that the memory system 1000 and/or the memory controller 1200 are currently operating in the standby-prevention mode (that is, "YES" at step S320), there is no need to change the operating mode.

When it is determined at step S320 that the memory system 1000 and/or the memory controller 1200 are not currently operating in the standby-prevention mode (that is, "NO" at step S320), it may be determined that they are operating in a normal mode. Therefore, the process proceeds to step S330 where the operating mode of the memory system 1000 and/or the memory controller 1200 is set to the standby-prevention mode.

When it is determined at step S310 that the value of the WAF is less than or equal to the upper standby-prevention threshold value $W_{THU}$ (that is, "NO" at step S310), whether the value of the WAF is less than the lower standby-prevention threshold value $W_{THL}$ is determined at step S315. When it is determined that the value of the WAF is less than the lower standby-prevention threshold value $W_{THL}$ (that is, "YES" at step S315), the memory system 1000 and/or the memory controller 1200 should operate in a normal mode. Accordingly, whether the memory system 1000 and/or the memory controller 1200 are currently operating in the normal mode is determined at step S325. When it is determined that the memory system 1000 and/or the memory controller 1200 are currently operating in the normal mode (that is, "YES" at step S325), there is no need to change the operating mode.

When it is determined at step S325 that the memory system 1000 and/or the memory controller 1200 are not currently operating in the normal mode (that is, "NO" at step S325), it may be determined that they are operating in the standby-prevention mode. Therefore, the process proceeds to step S335 where the operating mode of the memory system 1000 and/or the memory controller 1200 is set to the normal mode.

When it is determined at step S315 that the value of the WAF is not less than the lower standby-prevention threshold value $W_{THL}$ (that is, "NO" at step S315), it may be determined that the WAF has a value between the upper standby-prevention threshold value $W_{THU}$ and the lower standby-prevention threshold value $W_{THL}$. In a range between the upper standby-prevention threshold value $W_{THU}$ and the lower standby-prevention threshold value $W_{THL}$, the operating mode of the memory system 1000 and/or the memory controller 1200 is not changed.

Figure 13:
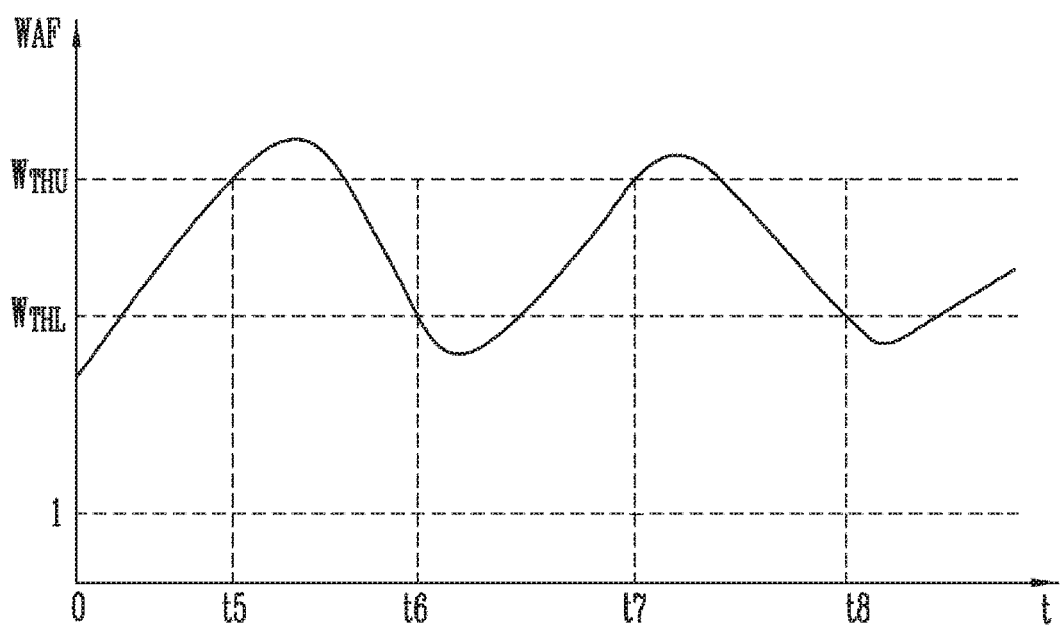
FIG. 13 is a graph illustrating changes of WAF over time and application of individual steps of FIG. 12 in this context, in accordance with an embodiment of the present disclosure.

FIG. 13 is a graph illustrating WAF changes with respect to $W_{THL}$ and $W_{THU}$ over time. The individual steps of FIG. 12 are described in the context of this WAF fluctuation.

Referring to the graph illustrated in FIG. 13, a horizontal axis denotes a time (t) axis, and a vertical axis denotes the WAF values of the memory system 1000 and/or the memory device 1100.

During an interval from time 0 to time t5, the memory system 1000 and/or the memory controller 1200 operate in a normal mode, and thus the value of the WAF may increase. Even during an interval in which the value of the WAF is less than the upper standby-prevention threshold value $W_{THU}$ and is greater than the lower standby-prevention threshold value $W_{THL}$, the operating mode is not changed.

After time t5, the value of the WAF of the memory system 1000 and/or the memory device 1100 is greater than the upper standby-prevention value $W_{THU}$, and the memory system 1000 and/or the memory controller 1200 are operating in a standby-prevention mode. Accordingly, the value of the WAF gradually decreases. Even if the value of the WAF becomes less than the upper standby-prevention threshold value $W_{THU}$, the operating mode is maintained until the value of the WAF becomes less than the lower standby-prevention threshold value $W_{THL}$. Therefore, during the interval from time t5 to time t6, the memory system 1000 and/or the memory controller 1200 operate in the standby-prevention mode.

After time t6, the value of the WAF of the memory system 1000 and/or the memory device 1100 is less than the lower standby-prevention value $W_{THL}$, and the memory system 1000 and/or the memory controller 1200 operate in the normal mode. Accordingly, the value of the WAF gradually increases. Even when the value of the WAF becomes greater than the lower standby-prevention threshold value $W_{THL}$, as it does later in the interval between t6 and t7, the operating mode is maintained until the value of the WAF becomes greater than the upper standby-prevention threshold value $W_{THU}$. Therefore, during an interval from time t6 to time t7, the memory system 1000 and/or the memory controller 1200 operate in the normal mode.

In this way, it can be seen that, during an interval from time t7 to time t8, the memory system 1000 and/or the memory controller 1200 operate in the standby-prevention mode, and then operate in the normal mode after time t8.

Comparing FIG. 11 with 13, FIG. 11 shows that the operating mode may be frequently changed based on the standby-prevention threshold value $W_{TH}$, whereas FIG. 13 shows that the operating mode may be less frequently changed based on the upper and lower standby-prevention threshold values $W_{THU}$ and $W_{THL}$.

Figure 14A:
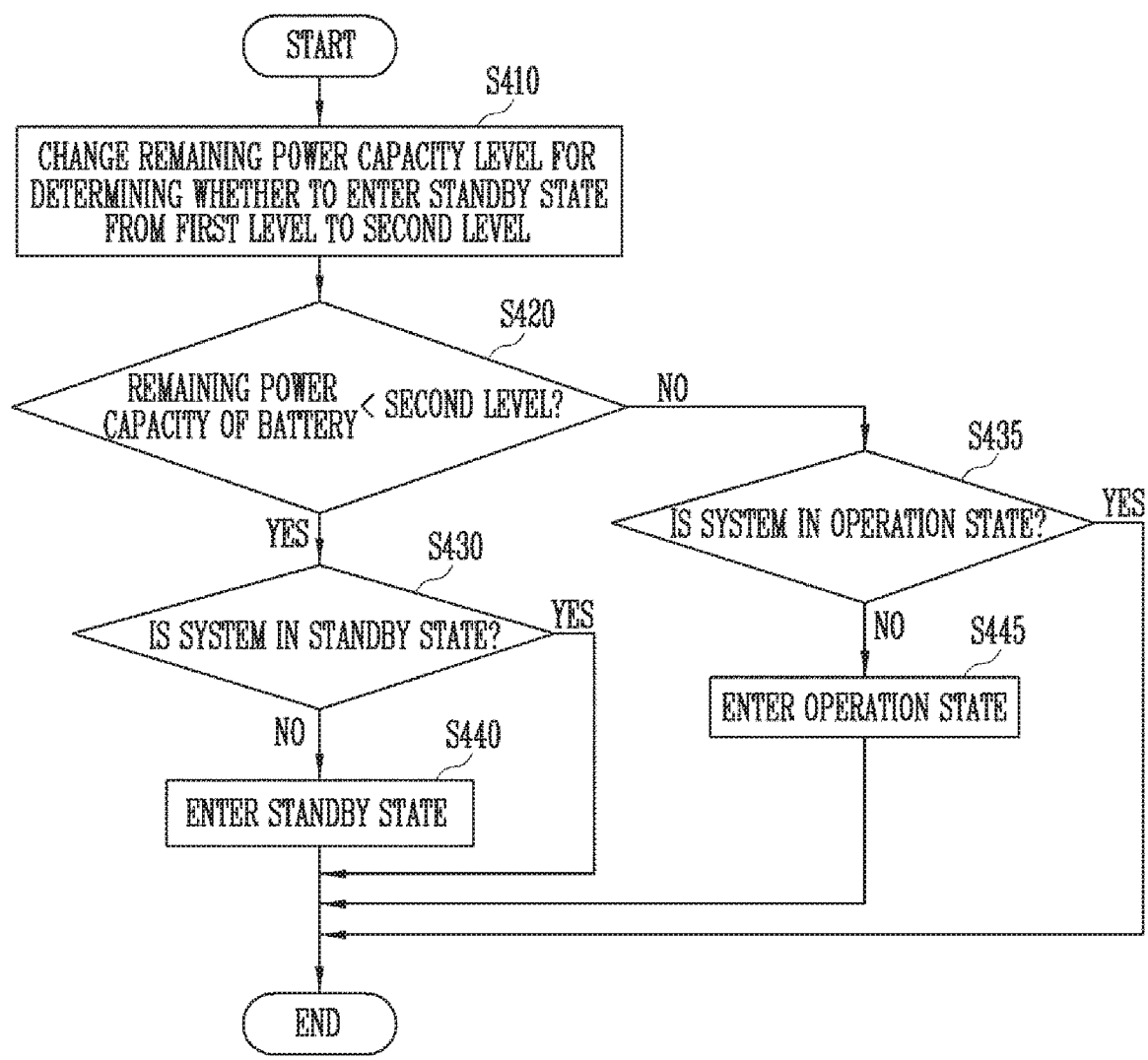
FIGS. 14A and 14B are flowcharts respectively describing a method of operating a memory controller in standby-prevention mode and a method of operating a memory controller in a normal mode, according to embodiments of the present disclosure.
Figure 14B:
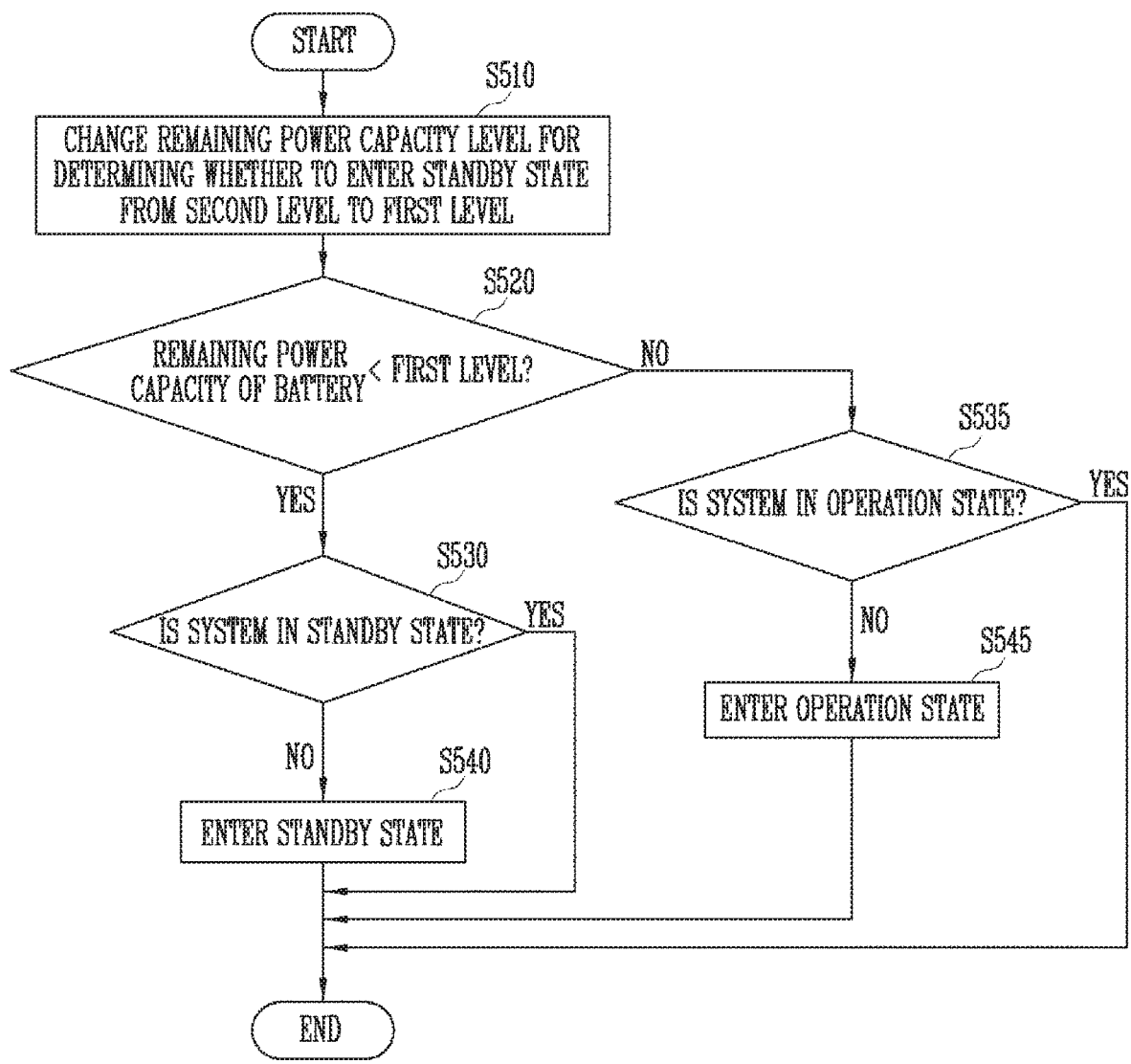

FIGS. 14A and 14B are flowcharts respectively describing a method of operating a memory controller in a standby-prevention mode and method of operating a memory controller in a normal mode according to embodiments of the present disclosure. FIGS. 14A and 14B illustrate embodiments in which whether to enter a standby state is determined based on the remaining power capacity of a power source (e.g., battery) for supplying power to the memory system 1000 or the memory controller 1200. FIG. 14A illustrates an embodiment in which the memory system 1000 and the memory controller 1200 operate in a standby-prevention mode, and FIG. 14B illustrates an embodiment in which the memory system 1000 and the memory controller 1200 operate in a normal mode.

Referring to FIG. 14A, at step S410, the memory system 1000 and the memory controller 1200 are determined to operate in the standby-prevention mode, and a remaining power capacity level for determining whether to enter the standby state is changed from a first level to a second level. The remaining power capacity level may mean power capacity remaining in the power source (for example, the battery) for supplying power to the memory system 1000 or the memory controller 1200.

At step S420, whether the remaining power capacity of the battery is less than the second level is determined. When it is determined that the remaining power capacity level of the battery is less than the second level (that is, "YES" at step S420), whether the memory system 1000 is in the standby state is determined at step S430. When it is determined that the memory system 1000 is in the standby state (that is, "YES" at step S430), the state is not changed. When it is determined that the memory system 1000 is not in the standby state (i.e., it is in an operation state) (that is, "NO" at step S430), the memory system 1000 enters the standby state at step S440.

When it is determined that the remaining power capacity level of the battery is greater than or equal to the second level (that is, "NO" at step S420), whether the memory system 1000 is in the operation state at step S435. When it is determined that the memory system 1000 is in the operation state (that is, "YES" at step S435), the state is not changed. When it is determined that the memory system 1000 is not in the operation state (i.e., in the standby state) (that is, "NO" at step S435), the memory system 1000 enters the operation state at step S445.

As described above, when the remaining power capacity of the power source (e.g., battery) coupled to the memory system 1000 becomes less than the second level, the memory system 1000 may enter the standby state, whereas when the remaining power capacity of the power source is greater than the second level, the memory system 1000 may enter the operation state.

Referring to FIG. 14B, at step S510, the memory system 1000 and the memory controller 1200 are determined to operate in a normal mode, and thus a remaining power capacity level for determining whether to enter a standby state is changed from the second level to the first level. At step S520, whether the remaining power capacity of the battery is less than the first level is determined. When it is determined that the remaining power capacity of the battery is less than the first level (that is, "YES" at step S520), whether the memory system 1000 is in the standby state is determined at step S530. When it is determined that the memory system 1000 is in the standby state (that is, "YES" at step S530), the state is not changed. When it is determined that the memory system is not in the standby state (i.e., in the operation state) (that is, "NO" at step S530), the memory system 1000 enters the standby state at step S540.

When it is determined that the remaining power capacity of the battery is greater than or equal to the first level (that is, "NO" at step S520), whether the memory system 1000 is in the operation state is determined at step S535. When it is determined that the memory system 1000 is in the operation state (that is, "YES" at step S535), the state is not changed. When it is determined that memory system 1000 is not in the operation state (i.e., in the standby state) (that is, "NO" at step S535), the memory system 1000 enters the operation state at step S545.

As described above, when the remaining power capacity of the power source coupled to the memory system 1000 becomes less than the first level, the memory system 1000 may enter the standby state, whereas when the remaining power capacity of the power source is greater than or equal to the first level, the memory system 1000 may enter the operation state.

Referring to FIGS. 14A and 14B together, the value of the first level may be greater than that of the second level. Accordingly, in FIG. 14A, when the remaining power capacity of the battery is less than the second level, the memory system 1000 enters the standby state. In contrast, in FIG. 14B, when the remaining power capacity of the battery is less than the first level, the memory system 1000 enters the standby state. It can be seen that the frequency of entry into the standby state in the embodiment of FIG. 14A is less than that in the embodiment of FIG. 14B. In this way, in accordance with an embodiment of the present disclosure, the frequency at which the memory system 1000 and/or the memory controller 1200 transition to the standby state decreases in the standby-prevention mode (FIG. 14A). As a result, the value of the WAF may decrease, and the useful lifespan of the memory device 1100 and the memory system 1000 including the memory device 1100 may be extended.

Figure 15A:
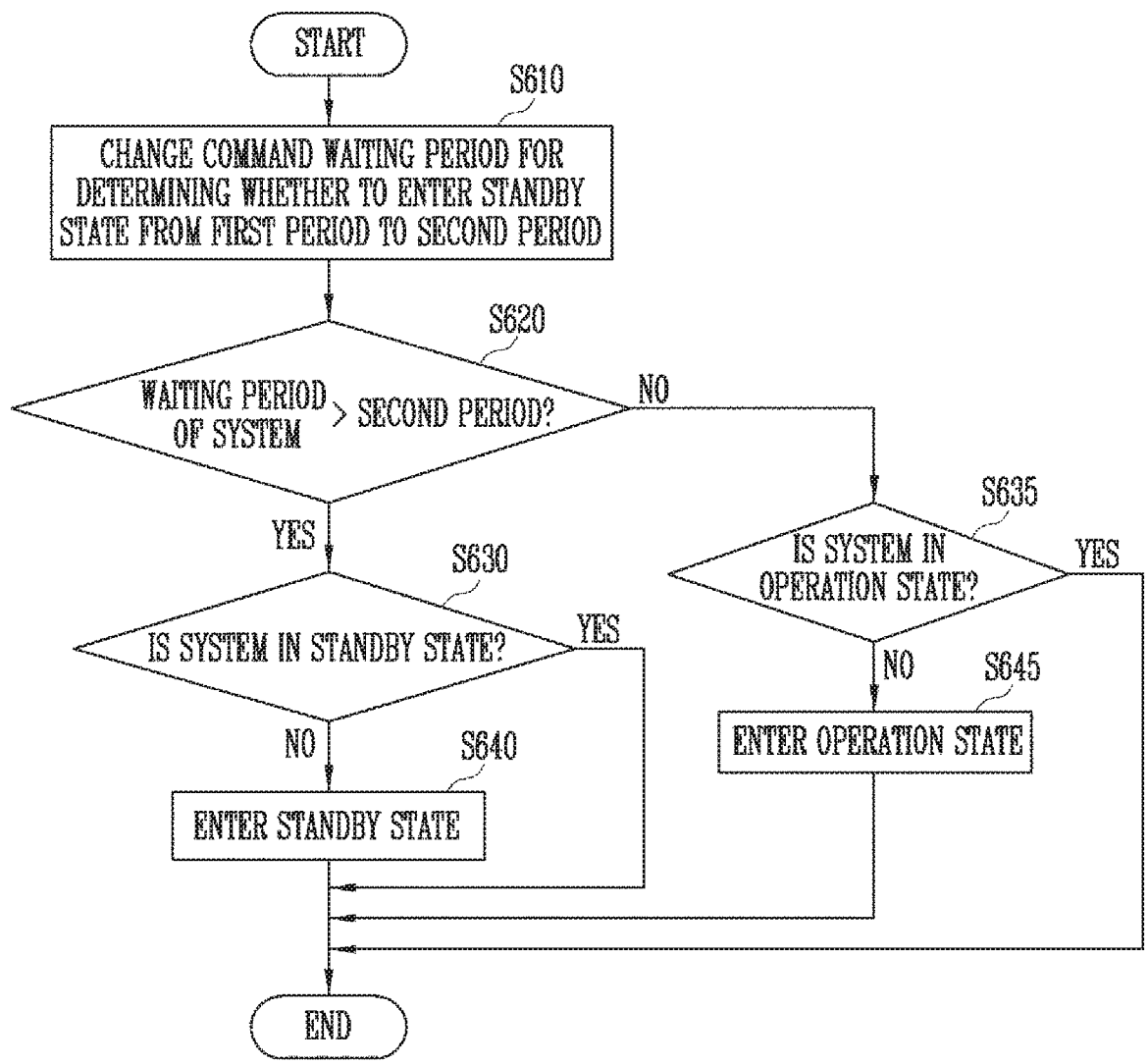
FIGS. 15A and 15B are flowcharts respectively describing a method of operating a memory controller in a standby-prevention mode and a method of operating a memory controller in a normal mode, according to embodiments of the present disclosure.
Figure 15B:
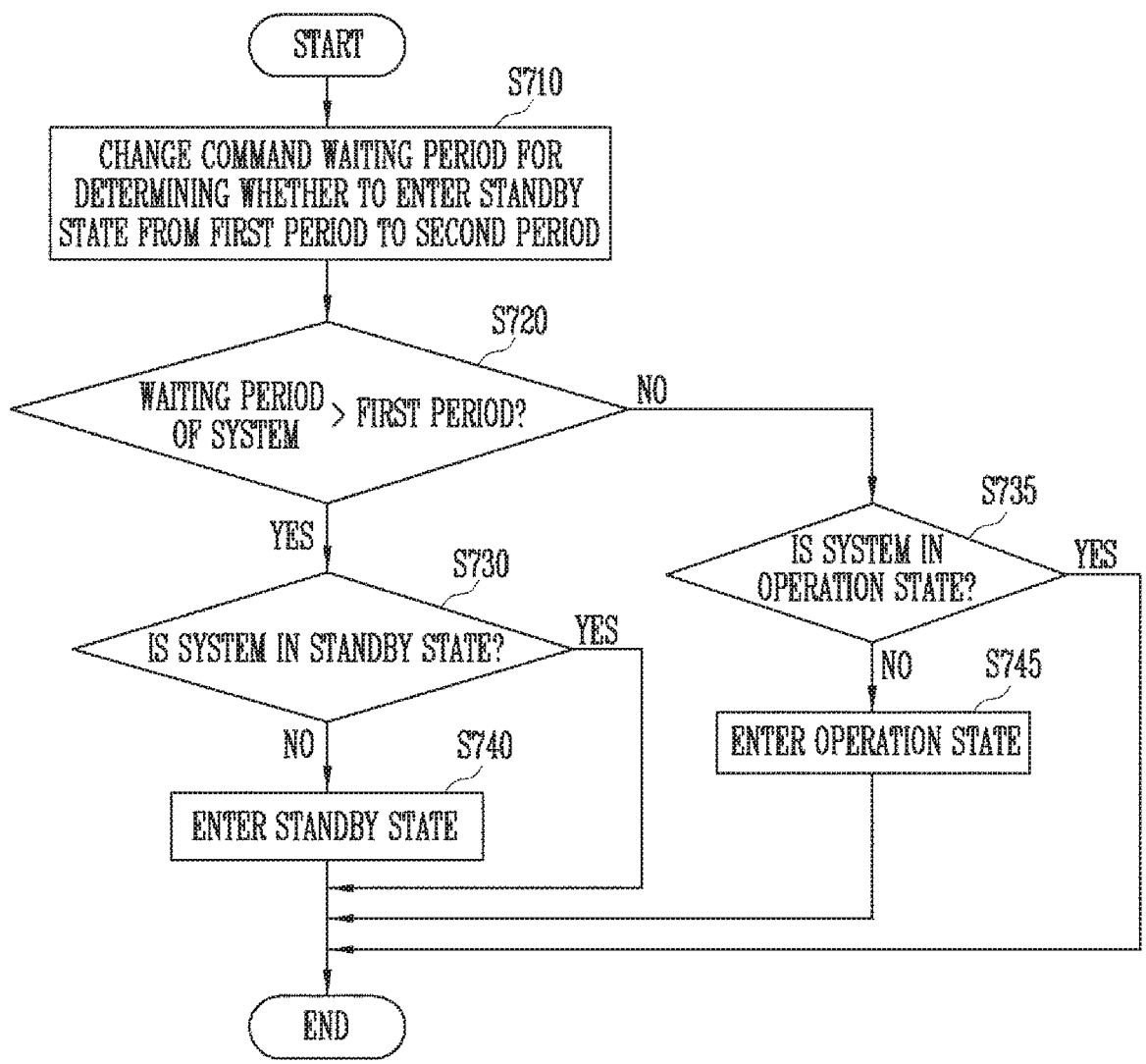

FIGS. 15A and 15B are flowcharts respectively describing a method of operating a memory controller in a standby-prevention mode and a method of operating a memory controller in a normal mode according to embodiments of the present disclosure.

FIGS. 15A and 15B illustrate embodiments in which whether to enter a standby state is determined based on a system waiting period, which is a period calculated from the time at which a memory system 1000 last receives a command from a host 2000. FIG. 15A illustrates an embodiment in which the memory system 1000 and the memory controller 1200 operate in a standby-prevention mode, and FIG. 15B illustrates an embodiment in which the memory system 1000 and the memory controller 1200 operate in a normal mode.

Referring to FIG. 15A, at step S610, the memory system 1000 and the memory controller 1200 are determined to operate in the standby-prevention mode, and thus a command waiting period for determining whether to enter a standby state is changed from a first period to a second period.

At step S620, it is determined whether the waiting period of the memory system 1000 is longer than the second period. The waiting period may represent a period from the time at which a command is last-received from the host 2000 to a current time. When it is determined that the waiting period of the system is longer than the second period (that is, "YES" at step S620), at step S630, whether the memory system 1000 is in the standby state is determined. When it is determined that the memory system 1000 is in the standby state (that is, "YES" at step S630), the state is not changed. When it is determined that the memory system 1000 is not in the standby state (i.e., in an operation state) (that is, "NO" at step S630), the memory system 1000 enters the standby state at step S640.

When it is determined that the waiting period of the system is not longer than the second period (that is, "NO" at step S620), whether the memory system 1000 is in the operation state is determined at step S635. When it is determined that the memory system 1000 is in the operation state (that is, "YES" at step S635), the state is not changed. When it is determined that the memory system 1000 is not in the operation state (i.e., in the standby state) (that is, "NO" at step S635), the memory system 1000 enters the operation state at step S645.

As described above, when the waiting period of the memory system 1000 is longer than the second period, the memory system 1000 enters the standby state, whereas the waiting period of the memory system 1000 is shorter than the second period, the memory system 1000 enters the operation state.

Referring to FIG. 15B, at step S710, the memory system 1000 and the memory controller 1200 are determined to operate in a normal mode, and thus the command waiting period for determining whether to enter a standby state is changed from the second period to the first period.

At step S720, it is determined whether the waiting period of the memory system 1000, that is, a period from the time at which a command is last-received from the host 200 to a current time, is longer than the first period. When it is determined that the waiting period of the system is longer than the first period (that is, "YES" at step S720), whether the memory system 1000 is in the standby state is determined at step S730. When it is determined that the memory system 1000 is in the standby state (that is, "YES" at step S730), the state is not changed. When it is determined that the memory system 1000 is not in the standby state (i.e., operation state) (that is, "NO" at step S730), the memory system 1000 enters the standby state at step S740.

When it is determined that the waiting period of the system is not longer than the first period (that is, "NO" at step S720), whether the memory system 1000 is in the operation state is determined at step S735. When it is determined that the memory system 1000 is in the operation state (that is, "YES" at step S735), the state is not changed. When it is determined that the memory system 1000 is not in the operation state (i.e., in the standby state) (that is, "NO" at step S735), the memory system 1000 enters the operation state at step S745.

As described above, when the waiting period of the memory system 1000 is longer than the first period, the memory system 1000 enters the standby state, whereas when the waiting period of the memory system 1000 is not longer than the first period, the memory system 1000 enters the operation state.

Referring to FIGS. 15A and 15B together, the value of the first period may be less than that of the second period. Accordingly, in FIG. 15A, when the waiting period is longer than the second period, the memory system 1000 enters the standby state. In contrast, in FIG. 15B, when the waiting period is longer than the first period, the memory system 1000 enters the standby state. It can be seen that the frequency of entry into the standby state in the embodiment of FIG. 15A is less than that in the embodiment of FIG. 15B. In this way, in accordance with an embodiment of the present disclosure, the frequency at which the memory system 1000 and/or the memory controller 1200 transition to the standby state decreases in the standby-prevention mode (FIG. 15A). As a result, the value of a WAF may decrease, and the useful lifespan of the memory device 1100 and the memory system 1000 including the memory device 1100 may be extended.

Figure 16:
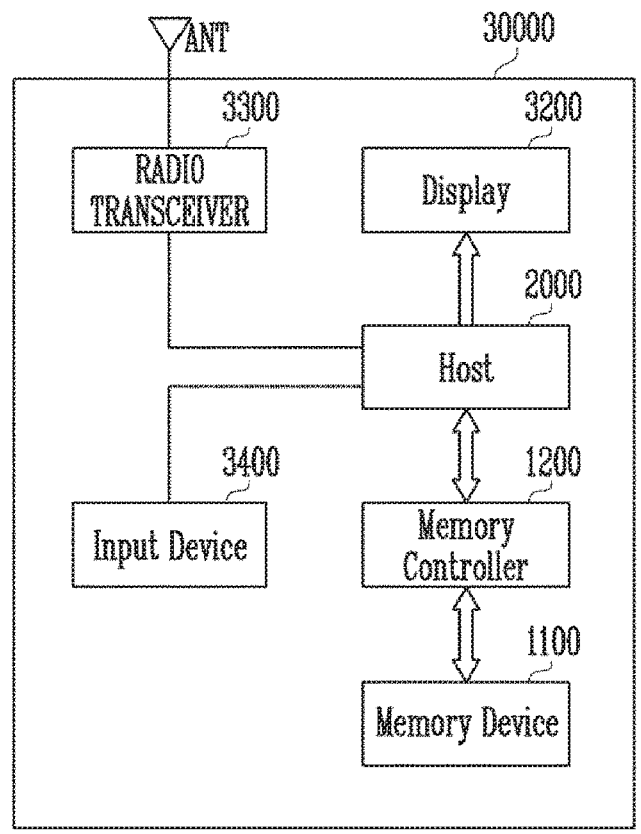
FIG. 16 is a diagram illustrating a memory system including a memory controller according to an embodiment of the present disclosure.

FIG. 16 is a diagram illustrating a memory system 30000 including a memory controller according to an embodiment of the present disclosure, for example, the memory controller 1200 of FIG. 7.

Referring to FIG. 16, the memory system 30000 may be implemented as a cellular phone, a smart phone, a tablet personal computer (PC), a personal digital assistant (PDA) or a wireless communication device.

The memory system 30000 may include the memory device 1100 and the memory controller 1200 that is capable of controlling the operation of the memory device 1100. The memory controller 1200 may control a data access operation of the memory device 1100, for example, a program operation, an erase operation or a read operation, under the control of a host 2000.

Data programmed to the memory device 1100 may be output via a display 3200 under the control of the memory controller 1200.

A radio transceiver 3300 may exchange radio signals through an antenna ANT. For example, the radio transceiver 3300 may convert radio signals received through the antenna ANT into signals that may be processed by the host 2000. Therefore, the host 2000 may process the signals output from the radio transceiver 3300, and may transmit the processed signals to the memory controller 1200 or the display 3200. The memory controller 1200 may transmit the signals, processed by the host 2000, to the memory device 1100. Further, the radio transceiver 3300 may convert signals output from the host 2000 into radio signals, and output the converted radio signals to an external device through the antenna ANT. An input device 3400 may be used to input a control signal for controlling the operation of the host 2000 or data to be processed by the host 2000. The input device 3400 may be implemented as a pointing device such as a touch pad or a computer mouse, a keypad or a keyboard. The host 2000 may control the operation of the display 3200 so that data from the memory controller 1200, data from the radio transceiver 3300, or data from the input device 3400 is output via the display 3200.

Figure 17:
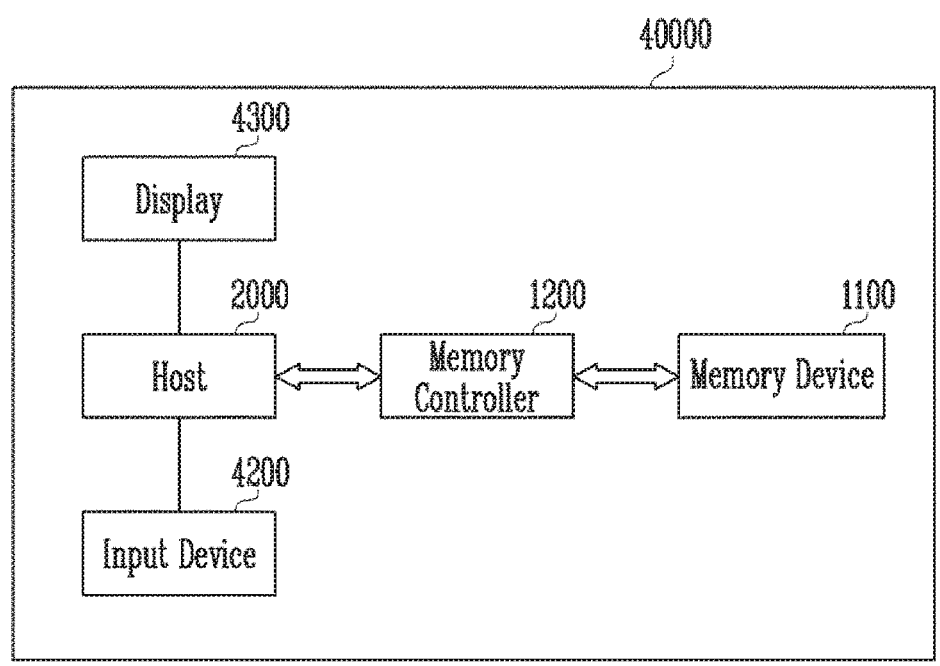
FIG. 17 is a diagram illustrating a memory system including a memory controller according to an embodiment of the present disclosure.

FIG. 17 is a diagram illustrating a memory system 40000 including a memory controller according to an embodiment of the present disclosure, for example, the memory controller 1200 of FIG. 7.

Referring to FIG. 17, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 that is capable of controlling a data processing operation of the memory device 1100.

The host 2000 may output data, stored in the memory device 1100, via a display 4300 according to data input through an input device 4200. For example, the input device 4200 may be implemented as a pointing device such as a touch pad or a computer mouse, a keypad or a keyboard.

The host 2000 may control the overall operation of the memory system 40000, and may control the operation of the memory controller 1200.

Figure 18:
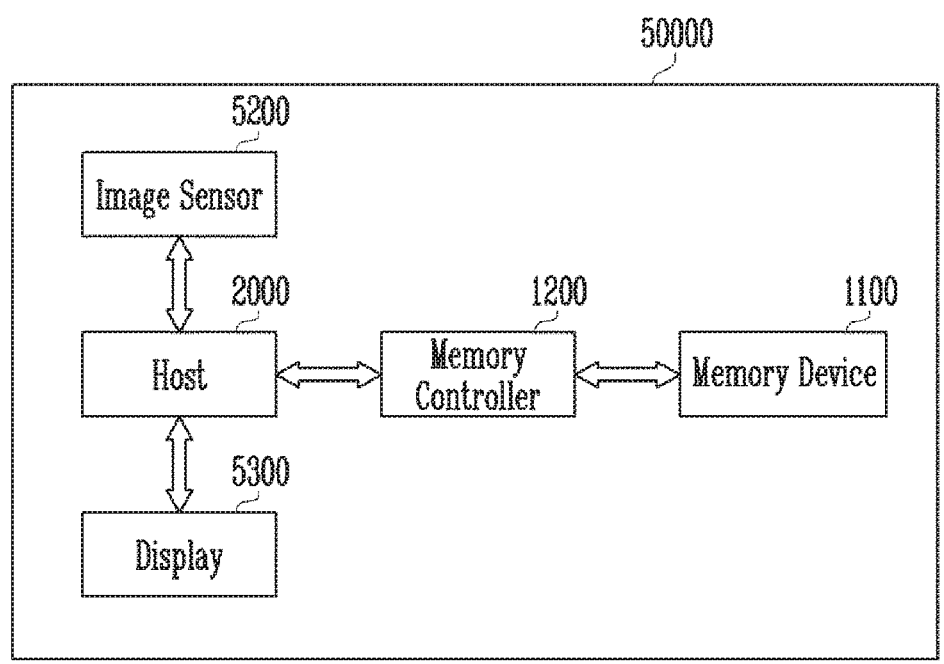
FIG. 18 is a diagram illustrating a memory system including a memory controller according to an embodiment of the present disclosure.

FIG. 18 is a diagram illustrating a memory system 50000 including a memory controller according to an embodiment of the present disclosure, for example, the memory controller 1200 of FIG. 7.

Referring to FIG. 18, the memory system 50000 may be embodied in an image processing device, e.g., a digital camera, a mobile phone provided with a digital camera, a smartphone provided with a digital camera, or a tablet personal computer (PC) provided with a digital camera.

The memory system 50000 may include the memory device 1100 and the memory controller 1200 that is capable of controlling a data processing operation of the memory device 1100, e.g., a program operation, an erase operation or a read operation.

An image sensor 5200 of the memory system 50000 may convert an optical image into digital signals, and the converted digital signals may be transmitted to the host 2000. Under the control of the host 2000, the converted digital signals may be output via a display 5300 or stored in the memory device 1100 through the memory controller 1200. Further, data stored in the memory device 1100 may be output via the display 5300 under the control of the host 2000.

Figure 19:
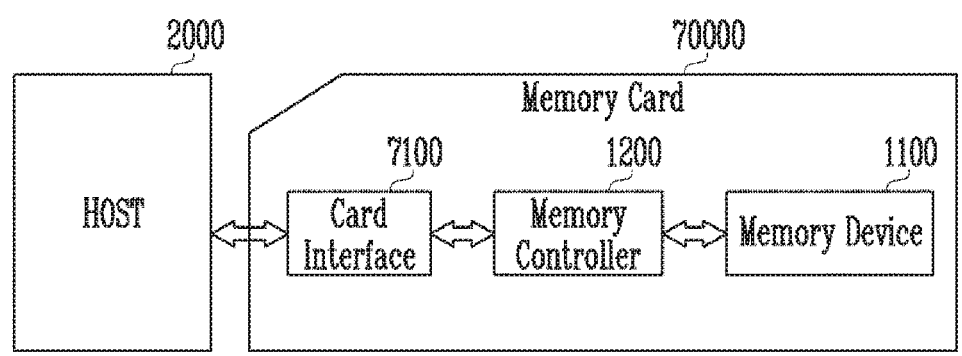
FIG. 19 is a diagram illustrating a memory system including a memory controller according to an embodiment of the present disclosure.

FIG. 19 is a diagram illustrating a memory system including a memory controller according to an embodiment of the present disclosure, for example, the memory controller 1200 of FIG. 7.

Referring to FIG. 19, the memory system may include a memory card 70000.

The memory card 70000 may be implemented as a smart card. The memory card 70000 may include the memory device 1100, the memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface. Further, the card interface 7100 may interface data exchange between the host 2000 and the memory controller 1200 according to a protocol of the host 2000. In an embodiment, the card interface 7100 may support a universal serial bus (USB) protocol and an interchip (IC)-USB protocol. Here, the card interface 7100 may refer to hardware capable of supporting a protocol which is used by the host 2000, software installed in the hardware, or a signal transmission method performed by the hardware.

In accordance with embodiments of the present disclosure, a memory controller is configured and operated to extend the useful lifespan of a memory system.

In accordance with embodiments of the present disclosure, a method of operating a memory controller is provided, which method can extend the useful lifespan of a memory system that includes the memory controller.

While the exemplary embodiments of the present disclosure have been described and illustrated, those skilled in the art will appreciate, in light of the present disclosure, that various modifications, additions and substitutions are possible. Therefore, the scope of the present invention is defined by the appended claims and equivalents of the claims rather than by the description preceding them.

What is claimed is:

1. A memory controller for controlling a memory device in response to a command received from a host, the memory controller comprising:
    a write amplification factor (WAF) storage configured to store a WAF of the memory device; and
    a standby state controller configured to control entry of the memory controller into a standby state based on a value of the WAF stored in the WAF storage.

2. The memory controller according to claim 1, wherein the standby state controller compares the value of the WAF with a standby-prevention threshold value, and controls entry of the memory controller into the standby state based on a result of the comparison.

3. The memory controller according to claim 2, wherein the standby state controller determines an operating mode of the memory controller as any one of a normal mode and a standby-prevention mode based on the result of the comparison.

4. The memory controller according to claim 3, wherein the standby state controller is configured to:
    when the value of the WAF is greater than the standby-prevention threshold value, control the memory controller so that the memory controller operates in the standby-prevention mode, and
    when the value of the WAF is less than or equal to the standby-prevention threshold value, control the memory controller so that the memory controller operates in the normal mode.

5. The memory controller according to claim 3, wherein the memory controller enters the standby state at a lower frequency in the standby-prevention mode than that in the normal mode.

6. The memory controller according to claim 5, wherein:
    the standby state controller determines whether to enter the standby state based on a remaining power capacity of a power source for supplying power to the memory controller,
    in the normal mode, the standby state controller controls the memory controller so that, when the remaining power capacity of the power source is less than a first level, the memory controller enters the standby state,
    in the standby-prevention mode, the standby state controller controls the memory controller so that, when the remaining power capacity of the power source is less than a second level, the memory controller enters the standby state, and
    the second level is less than the first level.

7. The memory controller according to claim 5, wherein:
    the standby state controller determines whether to enter the standby state, based on a waiting period measured from a time at which a command is last-received from the host,
    in the normal mode, the standby state controller controls the memory controller so that, when the waiting period is longer than a first period, the memory controller enters the standby state,
    in the standby-prevention mode, the standby state controller controls the memory controller so that, when the waiting period is longer than a second period, the memory controller enters the standby state, and
    the second period is longer than the first period.

8. The memory controller according to claim 3, wherein the memory controller is prevented from entering the standby state in the standby-prevention mode.

9. A method of operating a memory controller, the memory controller controlling an operation of a memory system including at least one memory device, the method comprising:
    determining a write amplification factor (WAF) of the memory system;
    comparing a value of the WAF with a standby-prevention threshold value; and
    controlling entry of the memory system into a standby state based on a result of the comparison.

10. The method according to claim 9, wherein controlling entry of the memory system into the standby state based on the result of the comparison comprises controlling the memory system so that the memory system operates in any one of a normal mode and a standby-prevention mode based on relative magnitudes of the value of the WAF and the standby-prevention threshold value.

11. The method according to claim 10, wherein controlling entry of the memory system into the standby state based on the result of the comparison comprises:
    when the value of the WAF is greater than the standby-prevention threshold value, controlling the memory system so that the memory system operates in the standby-prevention mode, and
    when the value of the WAF is less than or equal to the standby-prevention threshold value, controlling the memory system so that the memory system operates in the normal mode.

12. The method according to claim 10, wherein the memory system enters the standby state at a lower frequency in the standby-prevention mode than that in the normal mode.

13. The method according to claim 12, wherein controlling entry of the memory system into the standby state comprises:
    in the normal mode, when a remaining power capacity of a power source for supplying power to the memory system is less than a first level, controlling the memory system to enter the standby state,
    in the standby-prevention mode, when the remaining power capacity of the power source is less than a second level, controlling the memory system to enter the standby state, and
    wherein the second level is less than the first level.

14. The method according to claim 12, wherein controlling entry of the memory system into the standby state comprises:
- in the normal mode, when a waiting period measured from a time at which a command is last-received from the host is longer than a first period, controlling the memory system to enter the standby state,
- in the standby-prevention mode, when the waiting period is longer than a second period, controlling the memory system to enter the standby state, and
- wherein the second period is longer than the first period.

15. The method according to claim 12, wherein, in the standby-prevention mode, the memory system is prevented from entering the standby state.

16. A memory system comprising:
- a memory device; and
- a memory controller configured to control the memory device,
- wherein the memory controller:
- detects a write amplification factor of the memory device; and
- controls a frequency or number of times the memory system is permitted to transition from an operation state to a standby state based on the write amplification factor.

* * * * *